(12) United States Patent
Min et al.

(10) Patent No.: US 8,697,257 B2
(45) Date of Patent: Apr. 15, 2014

(54) COMPOUND FOR ORGANIC PHOTOELECTRIC DEVICE, ORGANIC PHOTOELECTRIC DEVICE INCLUDING THE SAME, AND DISPLAY DEVICE INCLUDING THE ORGANIC PHOTOELECTRIC DEVICE

(75) Inventors: Soo-Hyun Min, Uiwang-si (KR); Eun-Sun Yu, Uiwang-si (KR); Ho-Jae Lee, Uiwang-si (KR); Hyung-Sun Kim, Uiwang-si (KR); Young-Hoon Kim, Uiwang-si (KR); Eui-Su Kang, Uiwang-si (KR); Nam-Heon Lee, Uiwang-si (KR); Young-Sung Park, Uiwang-si (KR); Mi-Young Chae, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/534,479

(22) Filed: Jun. 27, 2012

(65) Prior Publication Data
US 2012/0267620 A1      Oct. 25, 2012

Related U.S. Application Data

(63) Continuation of application No. PCT/KR2010/007056, filed on Oct. 14, 2010.

(30) Foreign Application Priority Data

Dec. 28, 2009   (KR) .................. 10-2009-0132211

(51) Int. Cl.
*H01L 51/54*         (2006.01)
(52) U.S. Cl.
USPC ........... 428/690; 428/917; 313/504; 313/506; 257/40

(58) Field of Classification Search
None
See application file for complete search history.

(56) References Cited

U.S. PATENT DOCUMENTS

| | | | |
|---|---|---|---|
| 8,420,230 B2 * | 4/2013 | Yang et al. | 428/690 |
| 2004/0110031 A1 | 6/2004 | Fukuda et al. | |
| 2005/0260452 A1 | 11/2005 | Ise et al. | |
| 2006/0083945 A1 | 4/2006 | Morishita et al. | |

(Continued)

FOREIGN PATENT DOCUMENTS

| JP | 2002-193952 A | 7/2002 |
|---|---|---|
| JP | 2004-178895 A | 6/2004 |

(Continued)

OTHER PUBLICATIONS

Translation for JP 2009-021336 (publication date Jan. 2009).*

(Continued)

*Primary Examiner* — Dawn L. Garrett
(74) *Attorney, Agent, or Firm* — Lee & Morse P.C.

(57) ABSTRACT

A compound for an organic photoelectric device, an organic photoelectric device including the same, and a display device including the organic photoelectric device, the compound being represented by the following Chemical Formula 1:

[Chemical Formula 1]

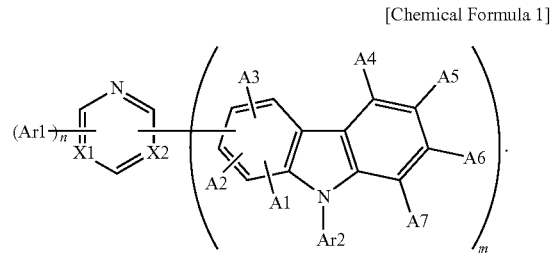

19 Claims, 3 Drawing Sheets

(56) References Cited

U.S. PATENT DOCUMENTS

| | | | |
|---|---|---|---|
| 2006/0186796 A1* | 8/2006 | Yabe et al. | 313/504 |
| 2008/0054783 A1 | 3/2008 | Xia | |
| 2010/0039026 A1* | 2/2010 | Yang et al. | 313/504 |
| 2010/0207105 A1* | 8/2010 | Katakura et al. | 257/40 |
| 2010/0276673 A1 | 11/2010 | Jung et al. | |
| 2011/0042654 A1 | 2/2011 | Jung et al. | |

FOREIGN PATENT DOCUMENTS

| | | |
|---|---|---|
| JP | 2005-093159 * | 4/2005 |
| JP | 2009-021336 A | 1/2009 |
| KR | 10 2009-0028346 A | 3/2009 |
| KR | 10 2009-0028357 A | 3/2009 |
| WO | WO 2005/076667 A1 | 8/2005 |

OTHER PUBLICATIONS

Translation for JP 2005-093159 (publication date Apr. 2005).*

Tang, et al.; Organic electroluminescent diodes; Applied Physics Letters; Sep. 21, 1987; pp. 913-915; vol. 51, Issue 12; American Institute of Physics; USA.

O'Brien, et al.; Improved energy transfer in electrophosphorescent devices; Applied Physics Letters; Jan. 18, 1999; pp. 442-444; vol. 74, No. 3; American Institute of Physics; USA.

Baldo, et al.; Very high-efficiency green organic light-emitting devices based on electrophosphorescence; Applied Physics Letters; Jul. 5, 1999; pp. 4-6; vol. 75; No. 1; American Institute of Physics; USA.

Adachi, et al.; Endothermic energy transfer: A mechanism for generating very efficient high-energy phosphorescent emission in organic materials; Applied Physics Letters; Sep. 24, 2001; pp. 2082-2084; vol. 79, No. 13; American Institute of Physics; USA.

International Search Report in PCT/KR2010/007056, dated Jul. 8, 2011 (Min, et al.).

* cited by examiner

COMPOUND FOR ORGANIC PHOTOELECTRIC DEVICE, ORGANIC PHOTOELECTRIC DEVICE INCLUDING THE SAME, AND DISPLAY DEVICE INCLUDING THE ORGANIC PHOTOELECTRIC DEVICE

CROSS-REFERENCE TO RELATED APPLICATION

This application is a continuation of pending International Application No. PCT/KR2010/007056, entitled, "Novel Compound for Organic Photoelectric and Organic Photoelectric Device Including the Same," which was filed on Oct. 14, 2010, the entire contents of which are hereby incorporated by reference.

BACKGROUND

1. Field of the Invention

Embodiments relate to a compound for an organic photoelectric device, an organic photoelectric device including the same, and a display device including the organic photoelectric device.

2. Description of the Related Art

An organic photoelectric device is, in a broad sense, a device for transforming photo-energy to electrical energy or conversely, a device for transforming electrical energy to photo-energy.

An organic photoelectric device may be classified as follows in accordance with its driving principles. One type of organic photoelectric device is an electronic device driven as follows: excitons are generated in an organic material layer by photons from an external light source; the excitons are separated into electrons and holes; and the electrons and holes are transferred to different electrodes as a current source (voltage source).

Another type of organic photoelectric device is an electronic device driven as follows: a voltage or a current is applied to at least two electrodes to inject holes and/or electrons into an organic material semiconductor positioned at an interface of the electrodes; and the device is driven by the injected electrons and holes.

Examples of an organic photoelectric device include an organic light emitting diode, an organic solar cell, an organic photo conductor drum, and an organic transistor. The organic photoelectric device may include a hole injecting or transporting material, an electron injecting or transporting material, and/or a light emitting material.

For example, an organic photoelectric device (organic light emitting diodes, OLED) has recently drawn attention due to an increase in demand for flat panel displays. In general, organic light emission refers to transformation of electrical energy to photo-energy.

SUMMARY

Embodiments are directed to a compound for an organic photoelectric device, an organic photoelectric device including the same, and a display device including the organic photoelectric device.

The embodiments may be realized by providing a compound for an organic photoelectric device, the compound being represented by the following Chemical Formula 1:

[Chemical Formula 1]

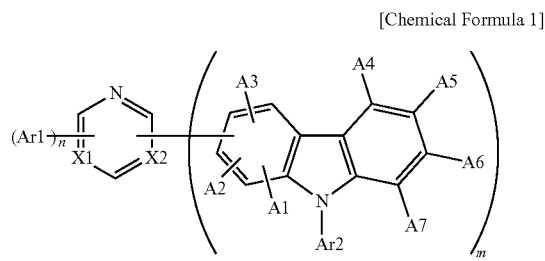

wherein, in Chemical Formula 1, Ar1 and Ar2 are each independently selected from the group of a substituted or unsubstituted C6 to C30 aryl group and a substituted or unsubstituted C2 to C30 heteroaryl group, A1 to A7 are each independently selected from the group of hydrogen, a substituted or unsubstituted C6 to C30 aryl group, a substituted or unsubstituted C2 to C30 heteroaryl group, and a substituted or unsubstituted C1 to C30 alkyl group, X1 and X2 are each independently N or CH, m+n=3, m and n are each integers, and m is not 0.

The compound represented by Chemical Formula 1 may be represented by the following Chemical Formula 2:

[Chemical Formula 2]

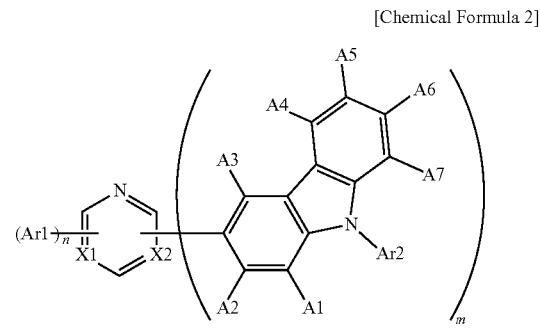

wherein, in Chemical Formula 2, Ar1 and Ar2 are each independently selected from the group of a substituted or unsubstituted C6 to C30 aryl group and a substituted or unsubstituted C2 to C30 heteroaryl group, A1 to A7 are each independently selected from the group of hydrogen, a substituted or unsubstituted C6 to C30 aryl group, a substituted or unsubstituted C2 to C30 heteroaryl group, and a substituted or unsubstituted C1 to C30 alkyl group, X1 and X2 are each independently N or CH, m+n=3, m and n are each integers, and m is not 0.

m may be 2 or 3, X1 and X2 may be N. m may be 2. X1 may be N. X2 may be N. Ar1 may be a substituted or unsubstituted phenyl group. Ar2 may be selected from the group of a substituted or unsubstituted phenyl group and a substituted or unsubstituted biphenyl group. A1 to A7 may each independently be selected from the group of a substituted or unsubstituted C6 to C12 aryl group and a substituted or unsubstituted C1 to C6 alkyl group.

The compound represented by Chemical Formula 1 may be represented by one of the following Chemical Formulae 3-11:

[Chemical Formula 3]
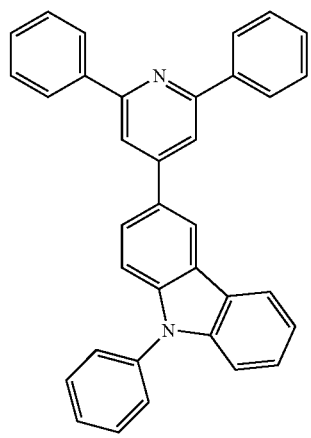
[Chemical Formula 6]
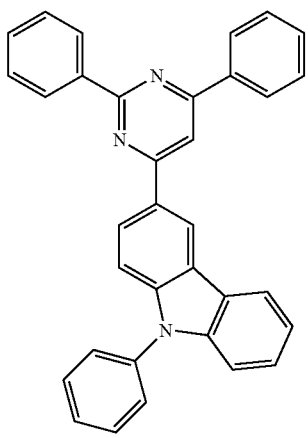
[Chemical Formula 4]
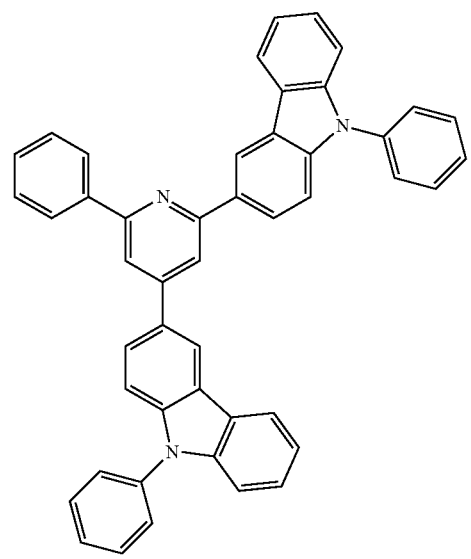
[Chemical Formula 7]
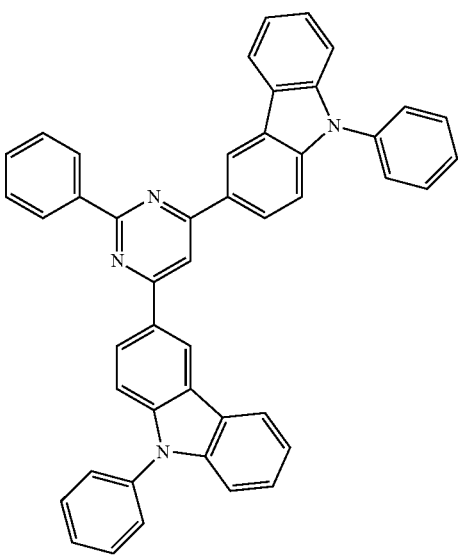
[Chemical Formula 5]
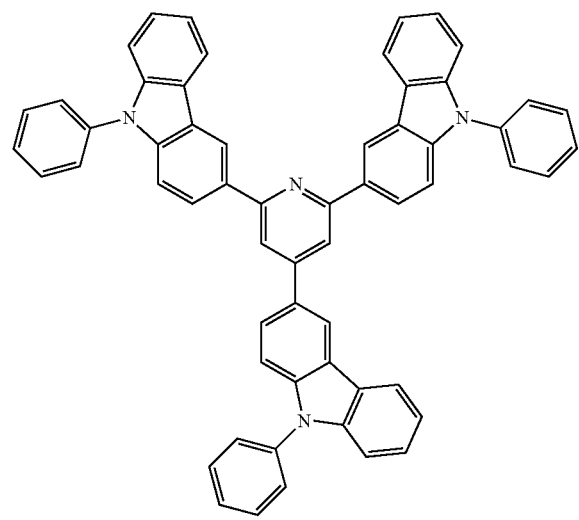
[Chemical Formula 8]
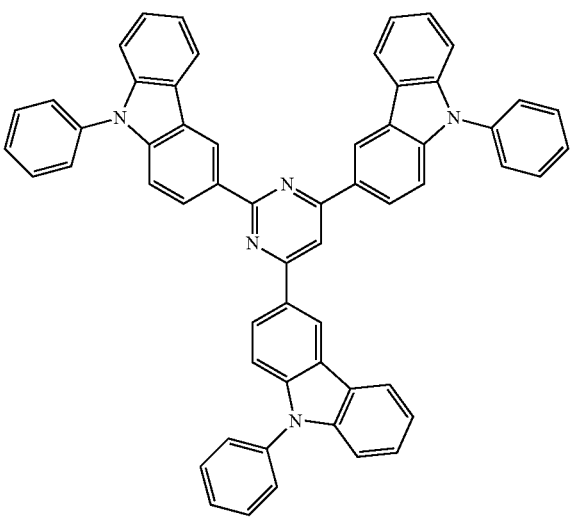

[Chemical Formula 9]
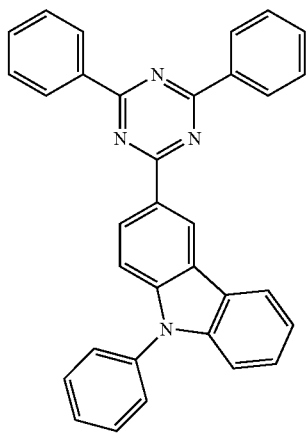
[Chemical Formula 10]
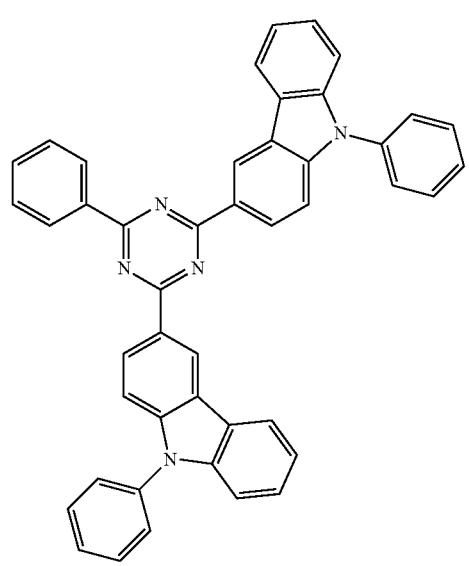
[Chemical Formula 11]
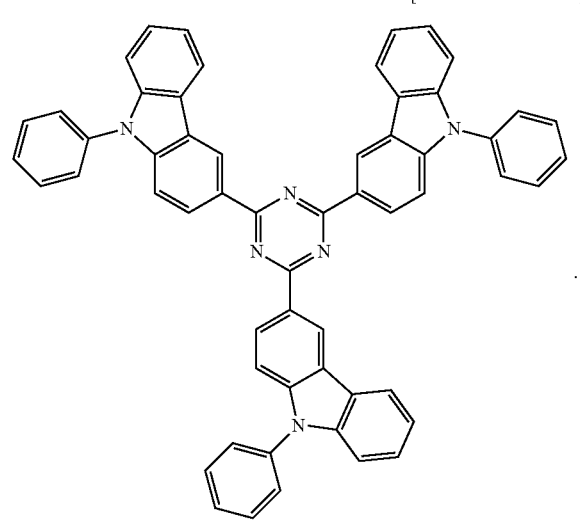
[Chemical Formula 12]
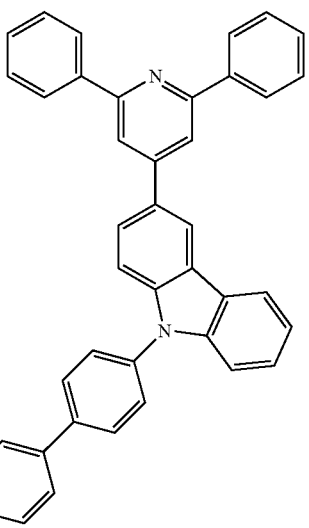
[Chemical Formula 13]
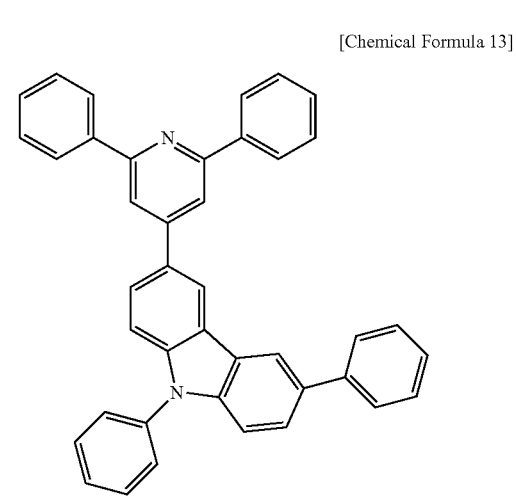
[Chemical Formula 14]
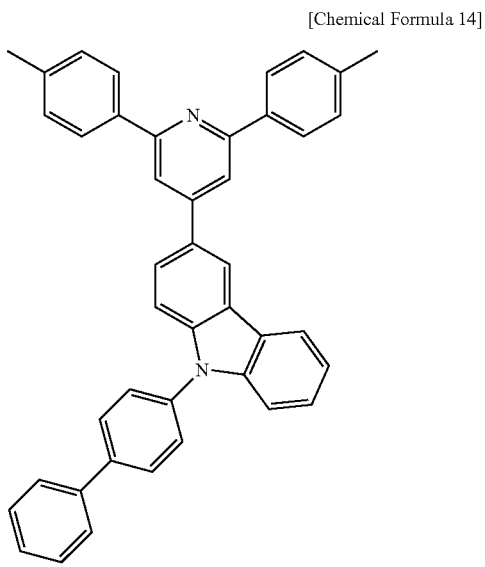
The compound represented by Chemical Formula 1 may be represented by one of the following Chemical Formulae 12-20:

[Chemical Formula 15]
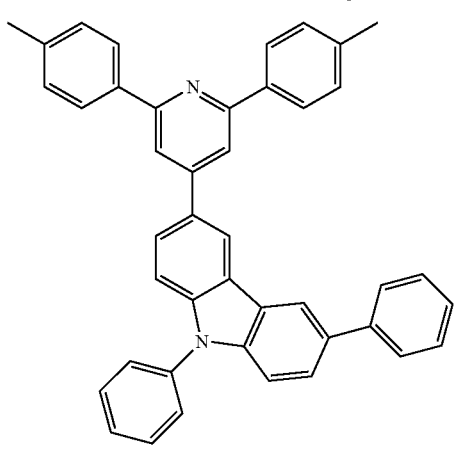
[Chemical Formula 16]
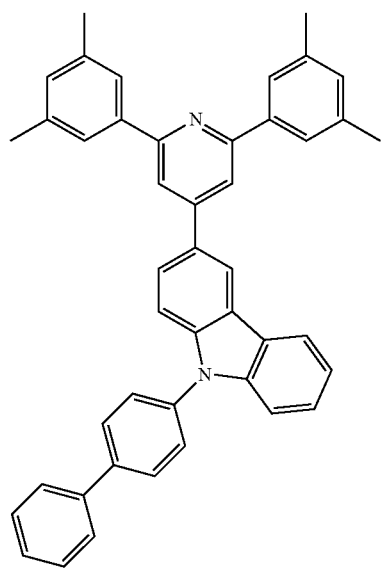
[Chemical Formula 17]
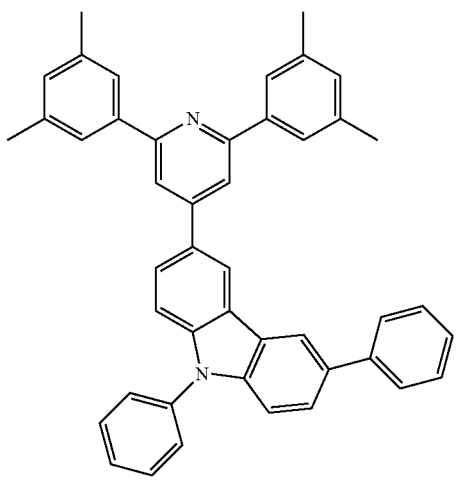
[Chemical Formula 18]
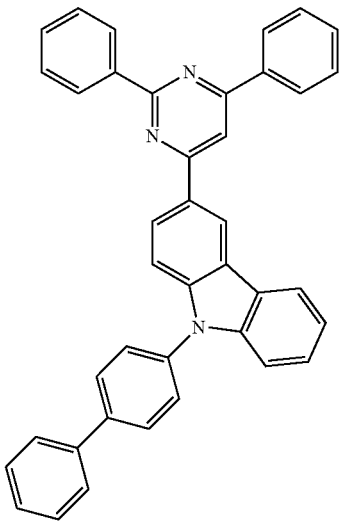
[Chemical Formula 19]
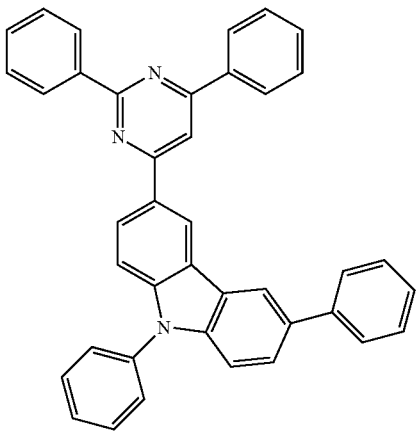
[Chemical Formula 20]
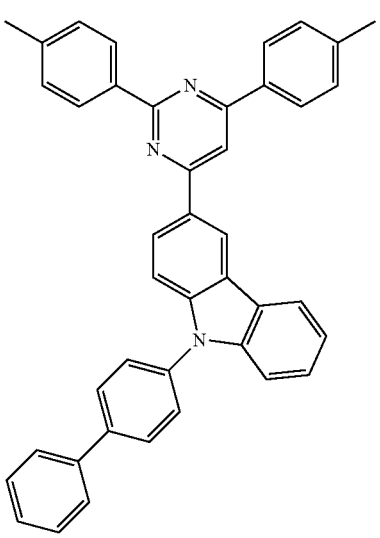
The compound represented by Chemical Formula 1 may be represented by one of the following Chemical Formulae 21-29:

[Chemical Formula 21]
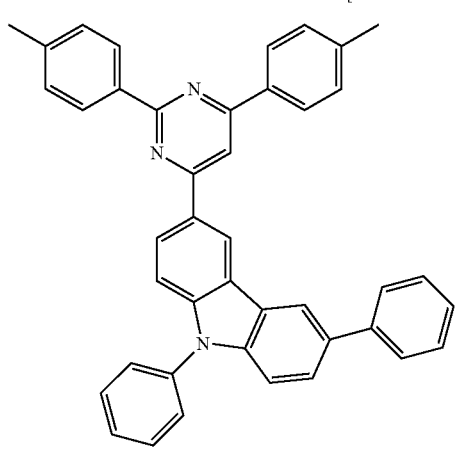
[Chemical Formula 24]
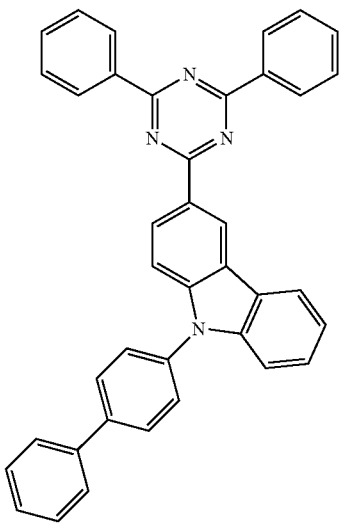
[Chemical Formula 22]
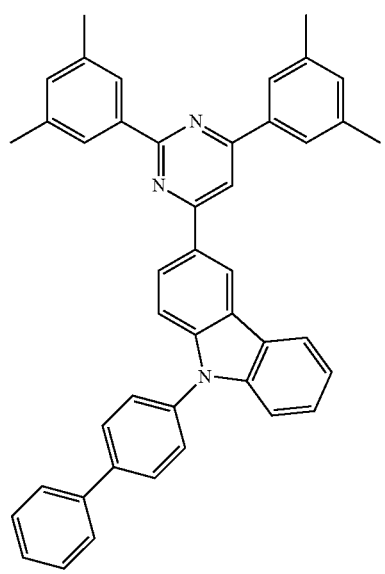
[Chemical Formula 25]
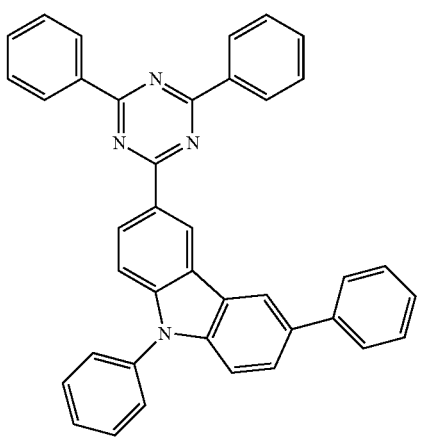
[Chemical Formula 23]
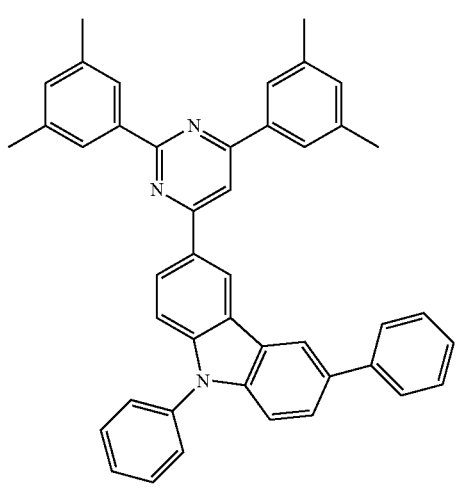
[Chemical Formula 26]
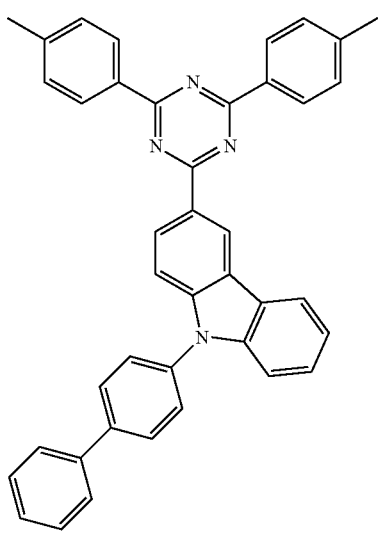

-continued

[Chemical Formula 27]

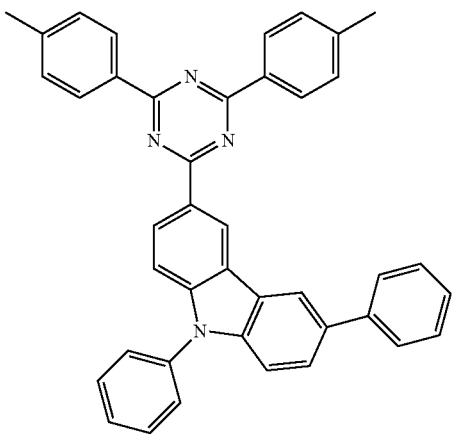

[Chemical Formula 28]

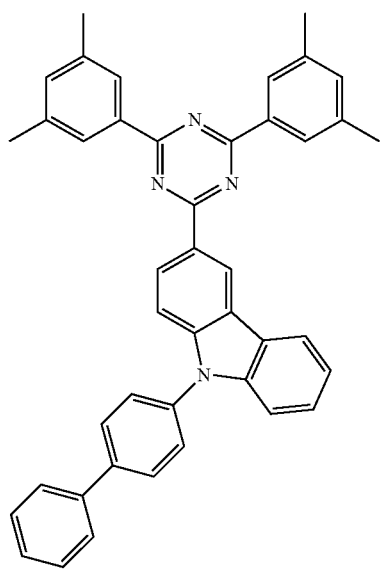

[Chemical Formula 29]

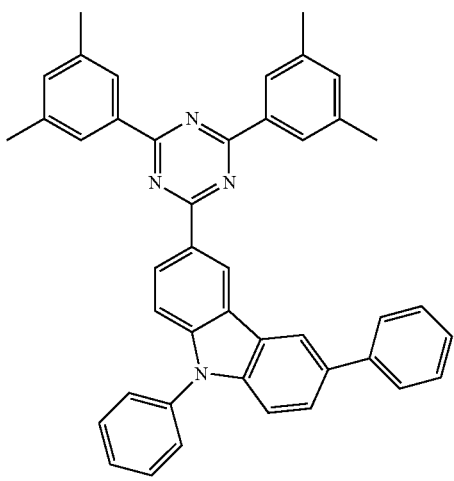

The embodiments may also be realized by providing an organic photoelectric device including an anode; a cathode; and at least one organic thin layer between the anode and the cathode, wherein the at least one organic thin layer includes the compound for an organic photoelectric device according to an embodiment.

The at least one organic thin layer may be selected from the group of an emission layer, a hole transport layer (HTL), a hole injection layer (HIL), an electron transport layer (ETL), an electron injection layer (EIL), a hole blocking layer, and a combination thereof.

The at least one organic thin layer may include an electron transport layer (ETL) or an electron injection layer (EIL), and the compound for an organic photoelectric device may be included in the electron transport layer (ETL) or the electron injection layer (EIL).

The at least one organic thin layer may include an emission layer, and the compound for an organic photoelectric device may be included in the emission layer.

The at least one organic thin layer may include an emission layer, and the compound for an organic photoelectric device may be a phosphorescent or fluorescent host material in the emission layer.

The at least one organic thin layer may include an emission layer, and the compound for an organic photoelectric device may be a fluorescent blue dopant material in the emission layer.

The organic photoelectric device may be selected from the group of an organic light emitting diode, an organic solar cell, an organic transistor, an organic photo conductor drum, and an organic memory device.

The embodiments may also be realized by providing a display device including the organic photoelectric device according to an embodiment.

BRIEF DESCRIPTION OF THE DRAWINGS

Features will become apparent to those of ordinary skill in the art by describing in detail exemplary embodiments with reference to the attached drawings in which.

DETAILED DESCRIPTION

Figure 1:
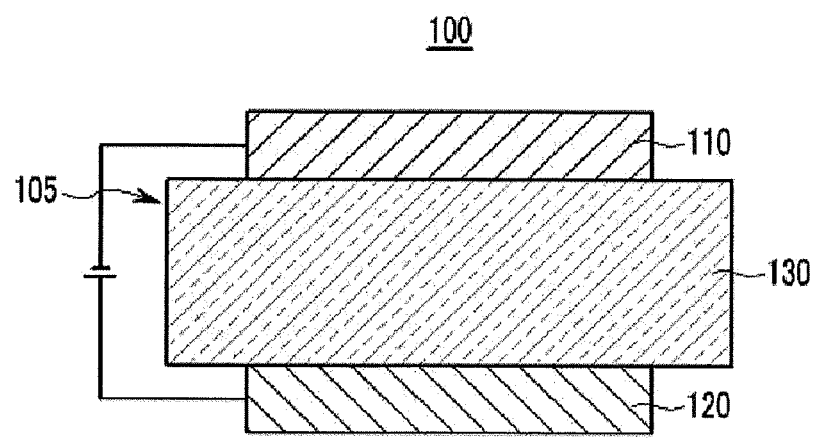
FIGS. 1 to 5 illustrate cross-sectional views of organic photoelectric devices including compounds for an organic photoelectric device according to embodiments.

Korean Patent Application No. 10-2009-00132211, filed on Dec. 28, 2009, in the Korean Intellectual Property Office, and entitled: "Novel Compound for Organic Photoelectric Device and Organic Photoelectric Device Including the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Through the specification, the term "substituted" may refer to one substituted with a C1 to C30 alkyl group, a C1 to C10 alkylsilyl group, a C3 to C30 cycloalkyl group, a C6 to C30 aryl group, a C1 to C10 alkoxy group, a fluoro group, a C1 to C10 trifluoroalkyl group such as a trifluoromethyl group, and the like, or a cyano group.

Through the specification, the term "hetero" may refer to one including 1 to 3 heteroatoms selected from the group of N, O, S, and P and carbons in the rest thereof, in one ring.

Through the specification, the term "a combination thereof" may refer to at least two substituents bound to each other by a linker or at least two substituents fused to each other.

Through the specification, when a definition is not otherwise provided, the term "alkyl" may refer to an aliphatic hydrocarbon group. The alkyl may be a "saturated alkyl group" that does not include any alkene or alkyne. The term "alkene" may refer to a group in which at least two carbon atoms are bound in at least one carbon-carbon double bond, and the term "alkyne" may refer to a group in which at least two carbon atoms are bound in at least one carbon-carbon triple bond. The alkyl may be branched, linear, or cyclic.

The alkyl group may have 1 to 20 carbon atoms. In an implementation, the alkyl group may be a medium-sized alkyl having 1 to 10 carbon atoms. In an implementation, the alkyl group may be a lower alkyl having 1 to 6 carbon atoms.

For example, a C1 to C4 alkyl may have 1 to 4 carbon atoms and may be selected from the group of methyl, ethyl, propyl, iso-propyl, n-butyl, iso-butyl, sec-butyl, and t-butyl.

Examples of the alkyl group may be include methyl, ethyl, propyl, isopropyl, butyl, isobutyl, t-butyl, pentyl, hexyl, ethenyl, propenyl, butenyl, cyclopropyl, cyclobutyl, cyclopentyl, cyclohexyl, or the like, which may be individually and independently substituted.

The term "aryl" may refer to an aryl group including a carbocyclic aryl (e.g., phenyl) having at least one ring having a covalent pi electron system. The term may also refer to monocyclic or fused polycyclic (i.e., rings sharing adjacent pairs of carbon atoms) groups. In addition, this term may also refer to a spiro compound having a contact point of one carbon.

The term "heteroaryl" may refer to a heterocyclic aryl group including a carbocyclic aryl (e.g., pyridine) having at least one ring having a covalent pi electron system. The term may also refer to monocyclic or fused ring polycyclic (i.e., groups sharing adjacent pairs of carbon atoms) groups. In addition, the term may also refer to a spiro compound having a contact point of one carbon.

According to an embodiment, a compound for an organic photoelectric device may have a structure in which 1 to 3 substituted or unsubstituted carbazole groups are combined or bonded with a core of pyridine, pyrimidine, or triazine.

In an implementation, the compound for an organic photoelectric device may have various substituents that are introduced on the core and the substituted or unsubstituted carbazole group, and may have various energy band gaps. Thus, the compound may satisfy conditions desirable for an emission layer as well as an electron injection layer (EIL) and an electron transport layer.

When the compound having appropriate an energy level (depending on substituents) is used for an organic photoelectric device, electrons may be more efficiently transported, which may provide excellent effects on efficiency and a driving voltage. In addition, electrochemical and thermal stability may be achieved and, thus, life-span characteristics of an organic photoelectric device may be improved.

According to an embodiment, the compound for an organic photoelectric device may be represented by the following Chemical Formula 1.

[Chemical Formula 1]

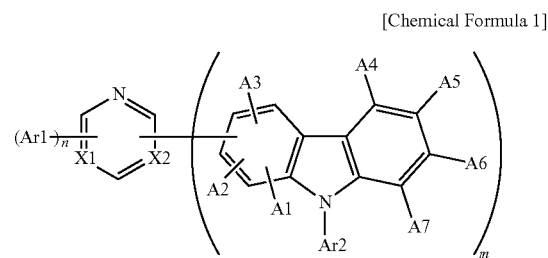

In Chemical Formula 1, Ar1 and Ar2 may each independently be selected from the group of a substituted or unsubstituted C6 to C30 aryl group and a substituted or unsubstituted C2 to C30 heteroaryl group.

For example, Ar1 and Ar2 may be selected in view of a π-conjugation length to thereby control light emission in a visible region. Accordingly, the compound may be usefully applied to an emission layer for an organic photoelectric device. In an implementation, the compound may have 30 carbon atoms or fewer, to help ensure effectiveness of a device.

A1 to A7 may each independently be selected from the group of hydrogen, a substituted or unsubstituted C6 to C30 aryl group, a substituted or unsubstituted C2 to C30 heteroaryl group, and a substituted or unsubstituted C1 to C30 alkyl group.

The compound having the structure in which a substituent is combined or bonded to the core may exhibit excellent thermal stability and/or oxidation resistance and thus, may improve life-span characteristics of an organic photoelectric device.

X1 and X2 may each independently be N or CH, m+n=3, m and n are each integers, and m is not 0. For example, a main body or core of the compound may be pyridine, pyrimidine, or triazine, which may have different properties (e.g., polarity or the like) and may be selected in view of desired characteristics of a device.

In addition, a number of a substituted or unsubstituted carbazole groups combined with or bonded to the core may be 1 to 3, as determined by m and n.

The number of substituted or unsubstituted carbazole groups may help regulate hole transport capability of the compound. In addition, a compound having such a three-dimensional shape may have a lower crystallinity. The compound having lower crystallinity may help improve life-span characteristics of a device.

In Chemical Formula 1, the substituted or unsubstituted carbazole group may be bound to the core at the 3 position of the carbazole group. In an implementation, the compound represented by Chemical Formula 1 may be represented by the following Chemical Formula 2.

[Chemical Formula 2]

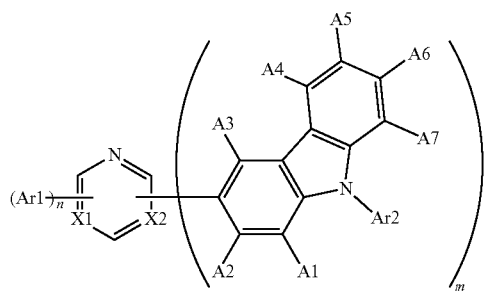

In Chemical Formula 2, Ar1, Ar2, X1, X2, and A1 to A7 may be the same as described above.

As shown in the above Chemical Formula 2, when the substituted or unsubstituted carbazole group is bound to the core at the 3 position of the carbazole group, the para position of N (nitrogen) having high electrochemical activity may be compensated, increasing stability of the compound.

In the above Chemical Formula 2, m may be 2 or 3. The compound may have a high molecular weight and a higher glass transition temperature (Tg), thereby improving thermal stability of a device.

In an implementation, Ar1 may be a substituted or unsubstituted phenyl group, and Ar2 may be selected from the group of a substituted or unsubstituted phenyl group and a substituted or unsubstituted biphenyl group.

When the substituent has the aforementioned number of carbon atoms, the compound may have a higher molecular weight, thereby improving thermal stability.

The compound for an organic photoelectric device according to an embodiment may be represented by one of the following Chemical Formulae 3 to 29. However, the embodiments are not limited to the following compounds.

[Chemical Formula 4]

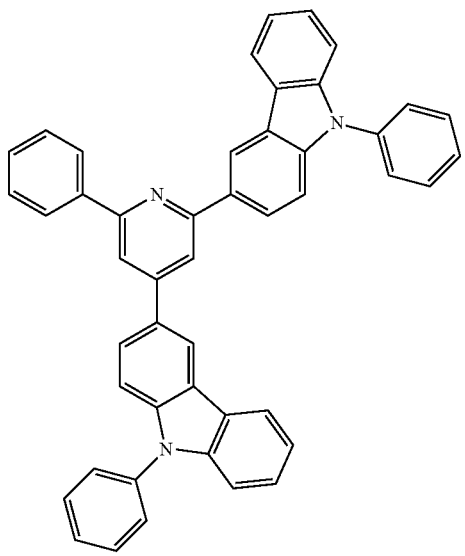

[Chemical Formula 5]

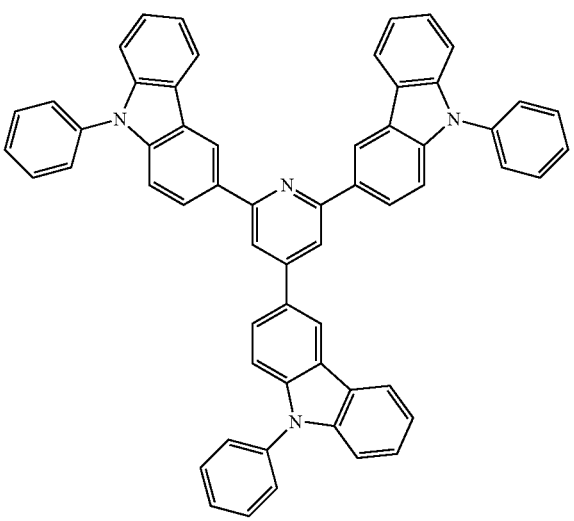

[Chemical Formula 3]

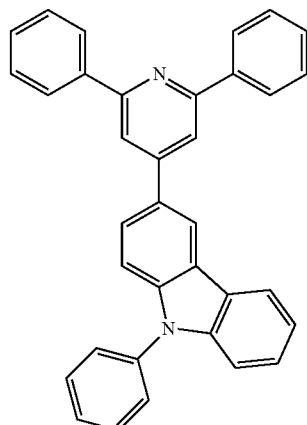

[Chemical Formula 6]

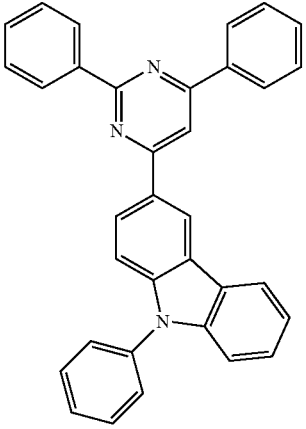

[Chemical Formula 7]
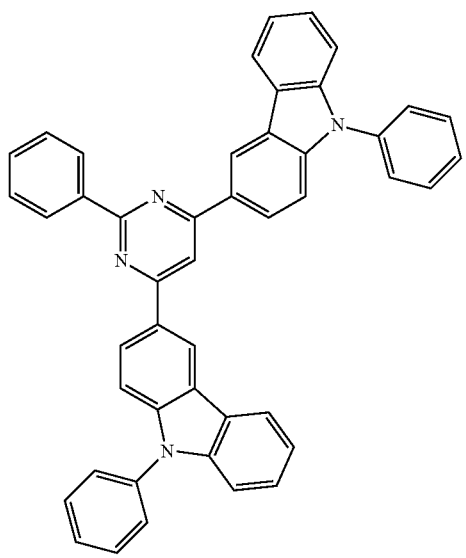
[Chemical Formula 8]
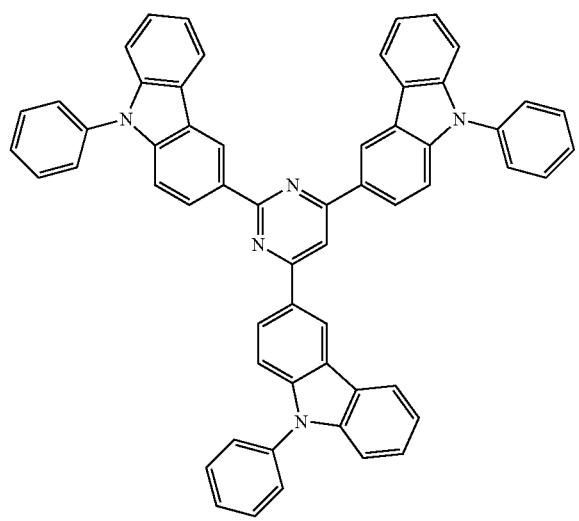
[Chemical Formula 9]
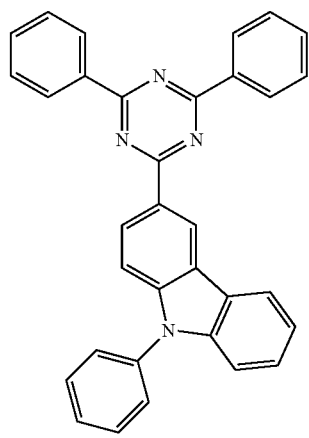
[Chemical Formula 10]
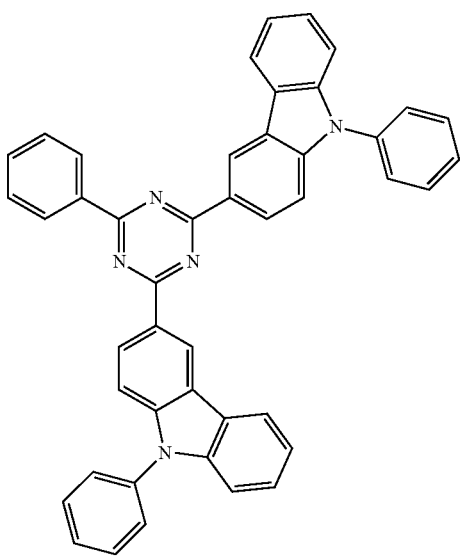
[Chemical Formula 11]
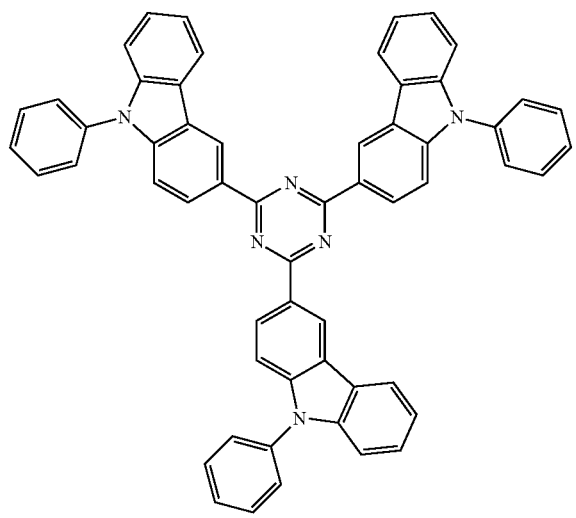
[Chemical Formula 12]
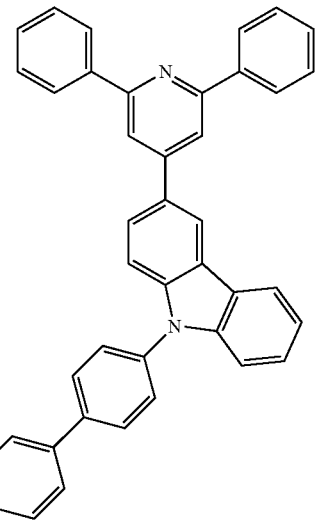

[Chemical Formula 13]
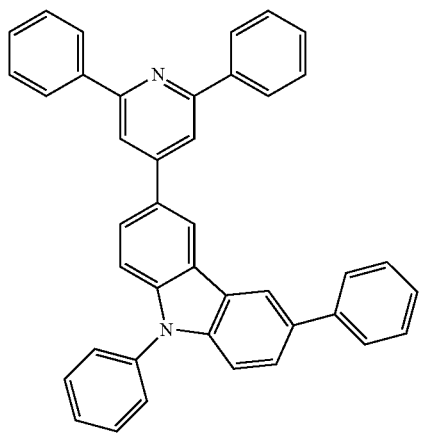
[Chemical Formula 14]
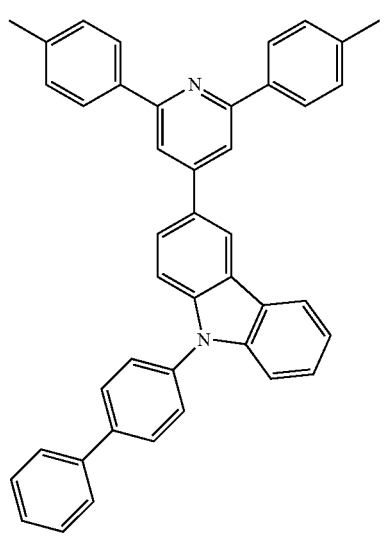
[Chemical Formula 15]
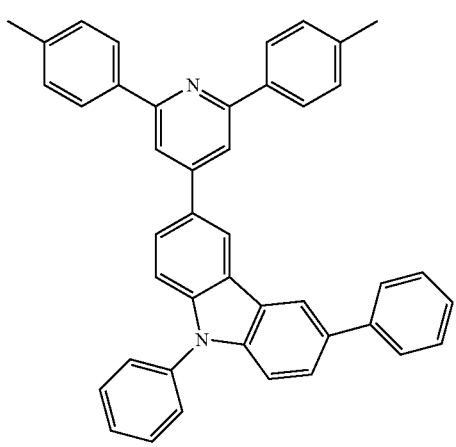
[Chemical Formula 16]
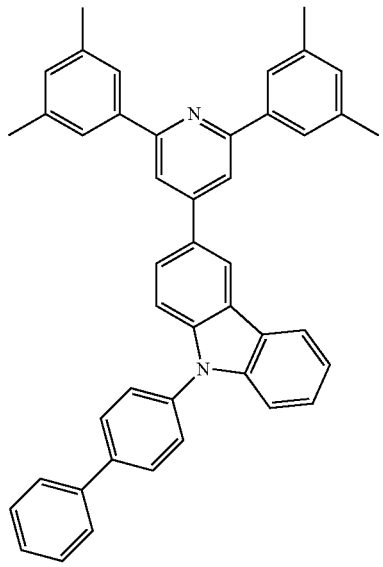
[Chemical Formula 17]
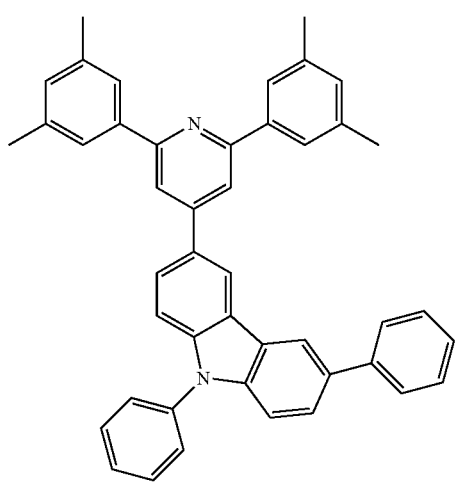
[Chemical Formula 18]
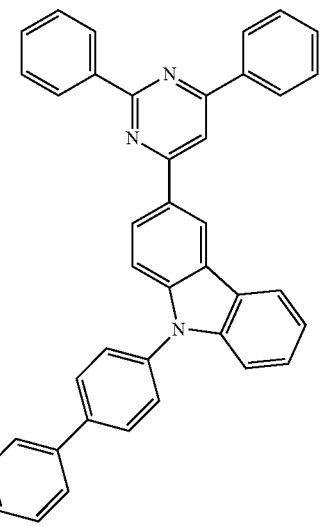

[Chemical Formula 19]
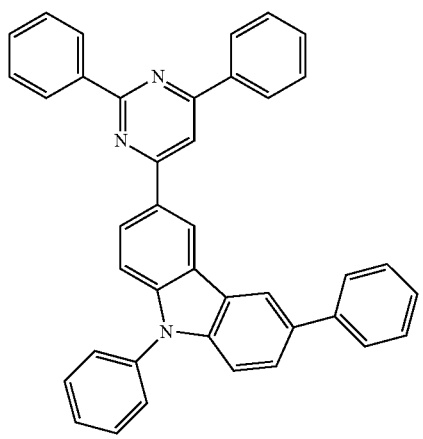
[Chemical Formula 20]
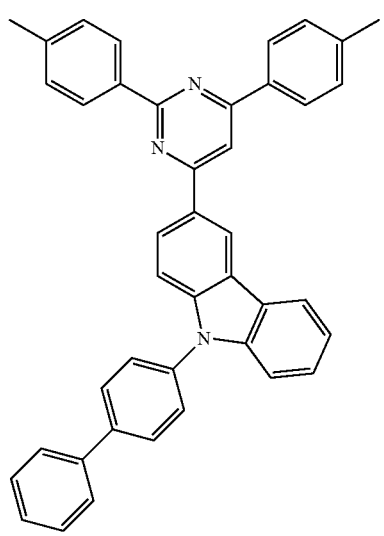
[Chemical Formula 21]
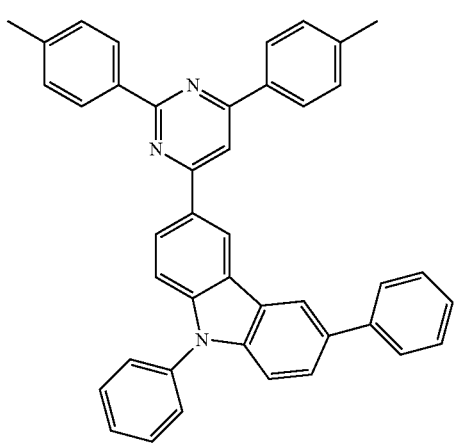
[Chemical Formula 22]
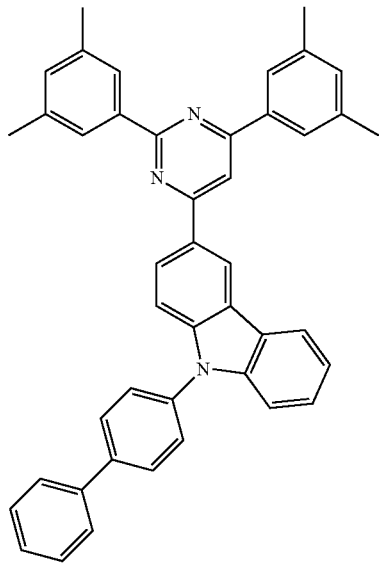
[Chemical Formula 23]
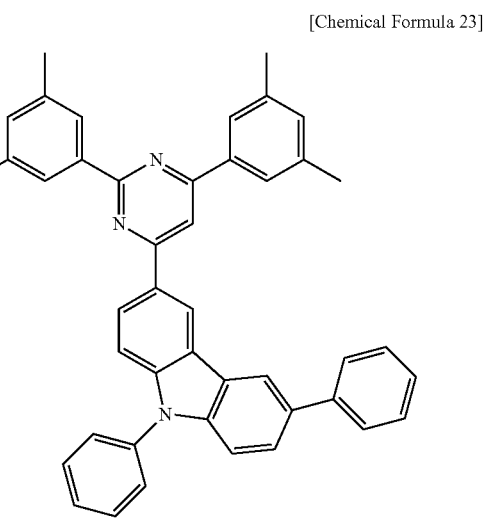
[Chemical Formula 24]
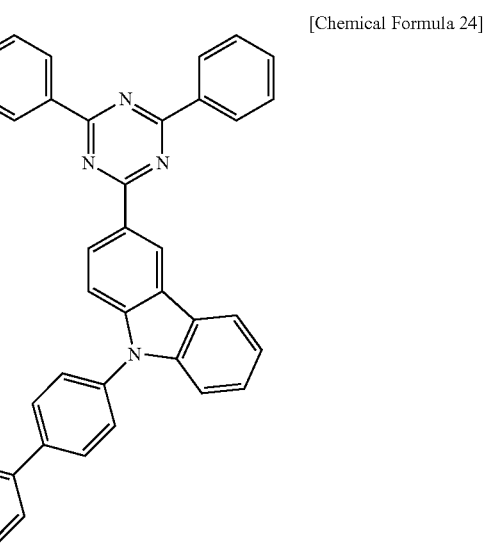

[Chemical Formula 25]

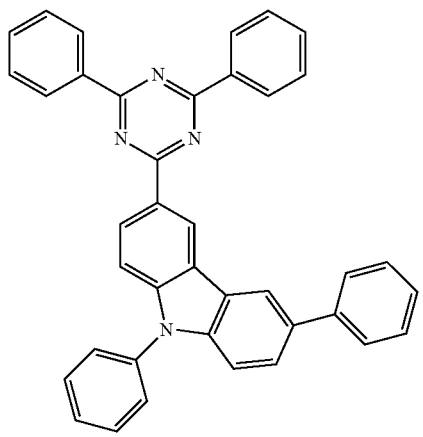

[Chemical Formula 26]

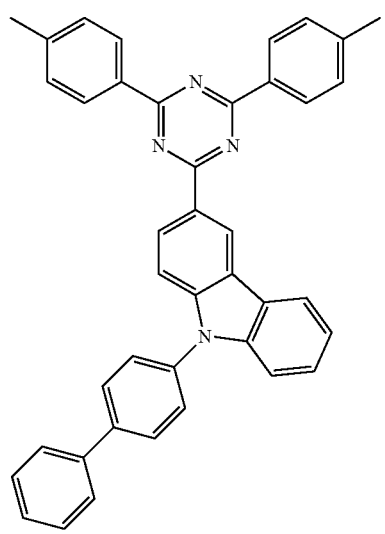

[Chemical Formula 27]

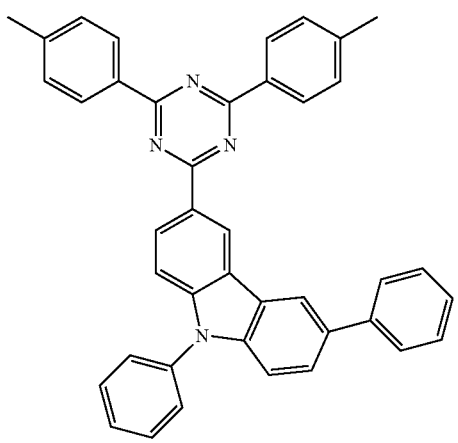

[Chemical Formula 28]

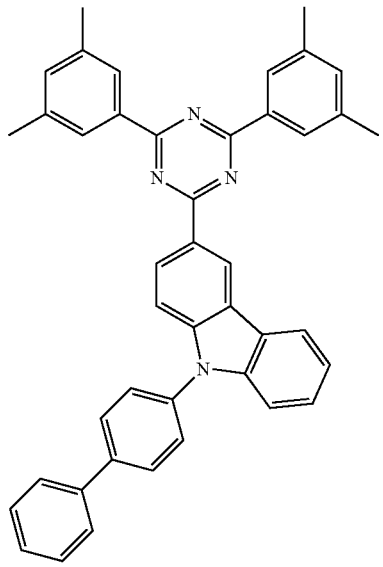

[Chemical Formula 29]

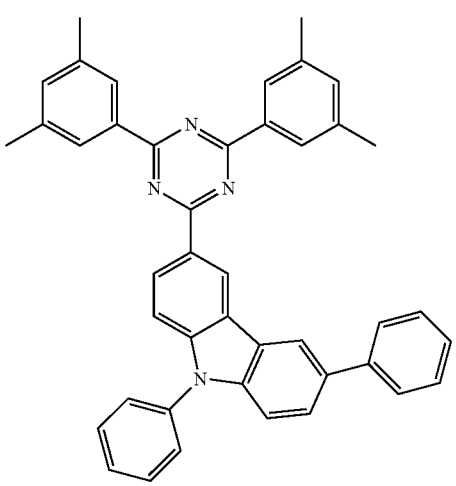

The compound according to an embodiment may have a glass transition temperature greater than or equal to about 110° C. The compound according to an embodiment may have a thermal decomposition temperature of greater than or equal to about 400° C. Accordingly, the compound may exhibit improved thermal stability. Thus, an organic photoelectric device having a high efficiency may be realized.

The compound for an organic photoelectric device according to an embodiment may play a role for emitting light or injecting and/or transporting electrons, and may act as a light emitting host together with a suitable dopant. In an implementation, the compound for an organic photoelectric device may be applied as, e.g., a phosphorescent or fluorescent host material, a blue light emitting dopant material, or an electron transport material.

The compound for an organic photoelectric device according to an embodiment may be used for an organic thin layer. Thus, the compound may help improve the life-span characteristic, efficiency characteristic, electrochemical stability, and thermal stability of an organic photoelectric device and may help decrease the driving voltage.

Another embodiment provides an organic photoelectric device that includes the compound for an organic photoelectric device. The organic photoelectric device may include, e.g., an organic light emitting diode, an organic solar cell, an organic transistor, an organic photosensitive drum, an organic memory device, or the like. For example, the compound for an organic photoelectric device according to an embodiment may be included in an electrode or an electrode buffer layer in the organic solar cell to help improve the quantum efficiency, and it may be used as an electrode material for a gate electrode, a source-drain electrode, or the like in the organic transistor.

Hereinafter, a detailed description relating to the organic photoelectric device will be provided.

The organic photoelectric device may include an anode, a cathode, and at least one organic thin layer interposed between the anode and the cathode. The at least one organic thin layer may include the compound for an organic photoelectric device according to an embodiment.

The at least one organic thin layer may include a layer selected from the group of an emission layer, a hole transport layer (HTL), a hole injection layer (HIL), an electron transport layer (ETL), an electron injection layer (EIL), a hole blocking film, and a combination thereof. The at least one layer may include the compound for an organic photoelectric device according to an embodiment. In an implementation, the electron transport layer (ETL) and/or the electron injection layer (EIL) may include the compound for an organic photoelectric device according to an embodiment. In an implementation, when the compound for an organic photoelectric device is included in the emission layer, the compound for an organic photoelectric device may be included as a phosphorescent or fluorescent host. In an implementation, the compound may be included in the emission layer as a fluorescent blue dopant material.

FIGS. 1 to 5 illustrate cross-sectional views of organic light emitting diodes including the compound for an organic photoelectric device according to an embodiment.

Referring to FIGS. 1 to 5, organic light emitting diodes 100, 200, 300, 400, and 500 according to an embodiment may include at least one organic thin layer 105 interposed between an anode 120 and a cathode 110.

The anode 120 may include an anode material laving a large work function to facilitate hole injection into the organic thin layer. The anode material may include, e.g., a metal such as nickel, platinum, vanadium, chromium, copper, zinc, and gold, or alloys thereof; a metal oxide such as zinc oxide, indium oxide, indium tin oxide (ITO), and indium zinc oxide (IZO); a combined metal and oxide such as ZnO:Al or $SnO_2$:Sb; or a conductive polymer such as poly(3-methylthiophene), poly[3,4-(ethylene-1,2-dioxy)thiophene] (PEDT), polypyrrole, and/or polyaniline. In an implementation, the anode 120 may include a transparent electrode including indium tin oxide (ITO).

The cathode 110 may include a cathode material having a small work function to facilitate electron injection into the organic thin layer. The cathode material may include, e.g., a metal such as magnesium, calcium, sodium, potassium, titanium, indium, yttrium, lithium, gadolinium, aluminum, silver, tin, and lead, or alloys thereof; or a multi-layered material such as LiF/Al, Liq/Al, $LiO_2$/Al, LiF/Ca, LiF/Al, and/or $BaF_2$/Ca. In an implementation, the cathode 110 may include a metal electrode including aluminum.

Referring to FIG. 1, the organic photoelectric device 100 may include an organic thin layer 105 including only an emission layer 130.

Figure 2:
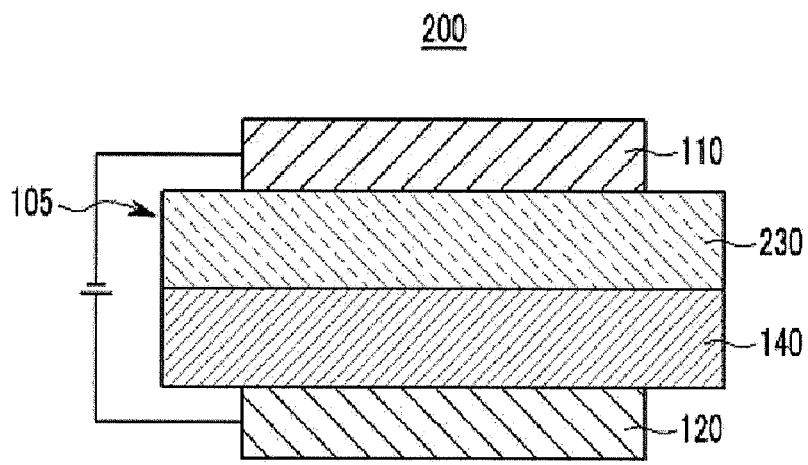

Referring to FIG. 2, a double-layered organic photoelectric device 200 may include an organic thin layer 105 including an emission layer 230 (including an electron transport layer (ETL)) as well as a hole transport layer (HTL) 140. As shown in FIG. 2, the organic thin layer 105 may include a double layer of the emission layer 230 and the hole transport layer (HTL) 140.

Figure 3:
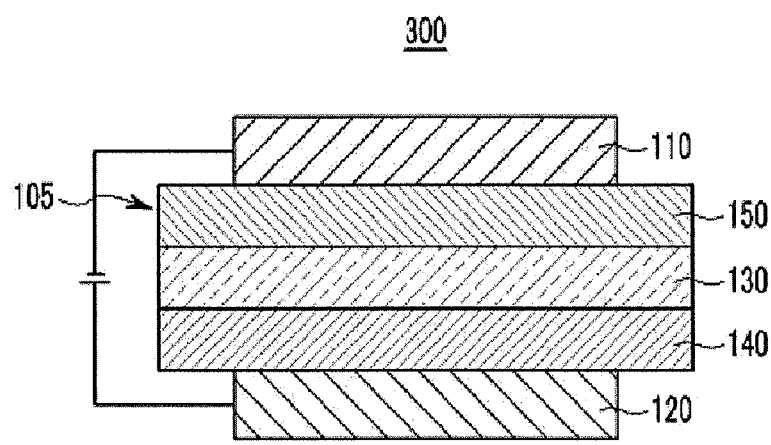

Referring to FIG. 3, a three-layered organic photoelectric device 300 may include an organic thin layer 105 including an electron transport layer (ETL) 150, an emission layer 130, and a hole transport layer (HTL) 140. The emission layer 130 may be independently installed, and layers having an excellent electron transporting property or an excellent hole transporting property may be separately stacked.

Figure 4:
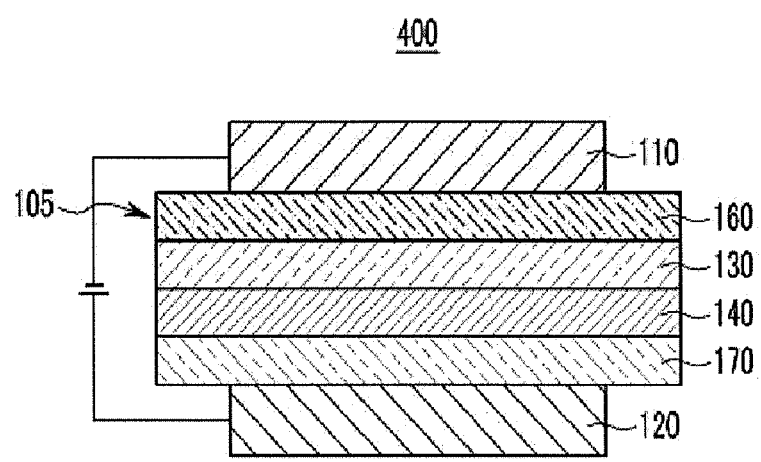

As shown in FIG. 4, a four-layered organic photoelectric device 400 may include an organic thin layer 105 including an electron injection layer (EIL) 160, an emission layer 130, a hole transport layer (HTL) 140, and a hole injection layer (HIL) 170 (for binding with the anode 120 of ITO).

Figure 5:
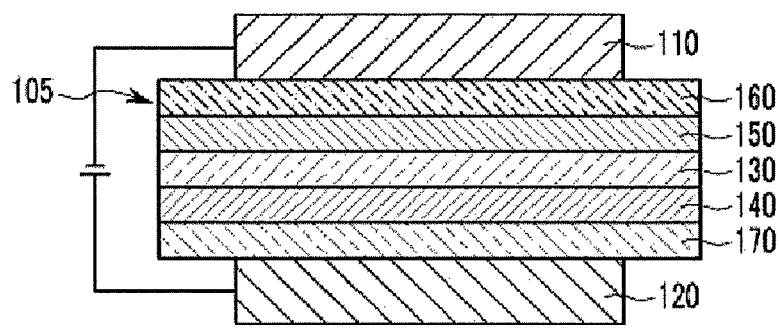

As shown in FIG. 5, a five layered organic photoelectric device 500 may include an organic thin layer 105 including an electron transport layer (ETL) 150, an emission layer 130, a hole transport layer (HTL) 140, a hole injection layer (HIL) 170, and an electron injection layer (EIL) 160 to achieve a low voltage.

In FIGS. 1 to 5, the organic thin layer 105 including at least one selected from the group of an electron transport layer (ETL) 150, an electron injection layer (EIL) 160, emission layers 130 and 230, a hole transport layer (HTL) 140, a hole injection layer (HIL) 170, and combinations thereof may include the compound for an organic photoelectric device according to an embodiment. The compound for the organic photoelectric device may be used for the electron transport layer (ETL) 150 or the electron injection layer (EIL) 160. When the compound is used for the electron transport layer (ETL), it is possible to provide an organic light emitting diode having a simplified structure because an additional hole blocking layer (not shown) may not be required.

In an implementation, when the compound for an organic photoelectric device is included in the emission layers 130 and 230, the compound for the organic photoelectric device may be included as a phosphorescent or fluorescent host or a fluorescent blue dopant.

The organic light emitting diode may be fabricated by, e.g., forming an anode on a substrate; forming an organic thin layer in accordance with a dry coating method (such as evaporation, sputtering, plasma plating, and ion plating) or a wet coating method (such as spin coating, dipping, and flow coating); and providing a cathode thereon.

An embodiment provides a display device including the organic photoelectric device according to an embodiment.

The following Examples and Comparative Examples are provided in order to set forth particular details of one or more embodiments. However, it will be understood that the embodiments are not limited to the particular details described. Further, the Comparative Examples are set forth to highlight certain characteristics of certain embodiments, and are not to be construed as either limiting the scope of the invention as exemplified in the Examples or as necessarily being outside the scope of the invention in every respect.

(Preparation of Compound for Organic Photoelectric Device)

EXAMPLE 1

Synthesis of Compound Represented by Chemical Formula 9

The compound represented by Chemical Formula 9 as a specific example of an embodiment was synthesized according to the following Reaction Scheme 1.

[Reaction Scheme 1]

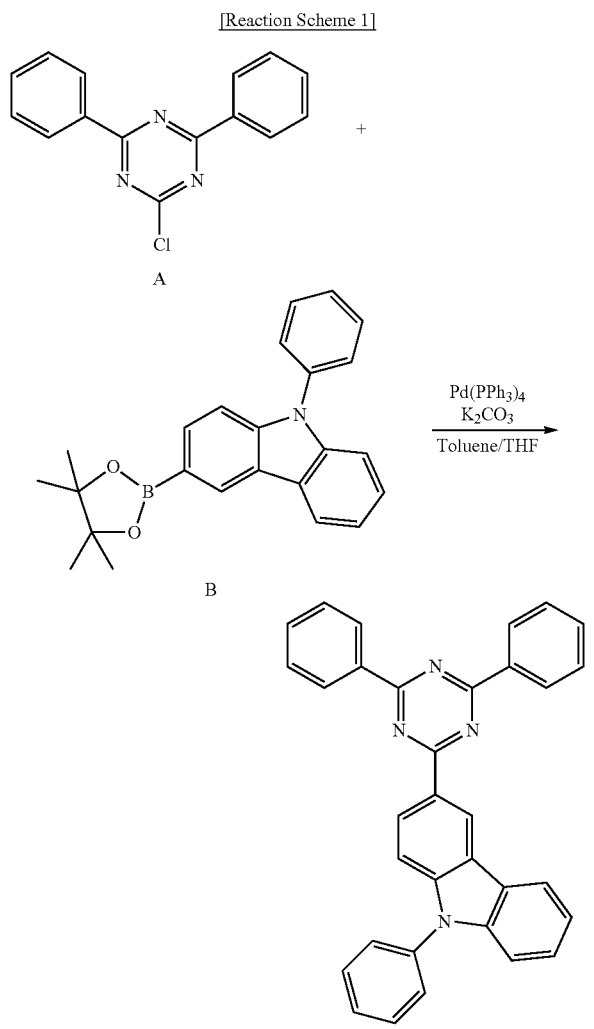

[Reaction Scheme 2]

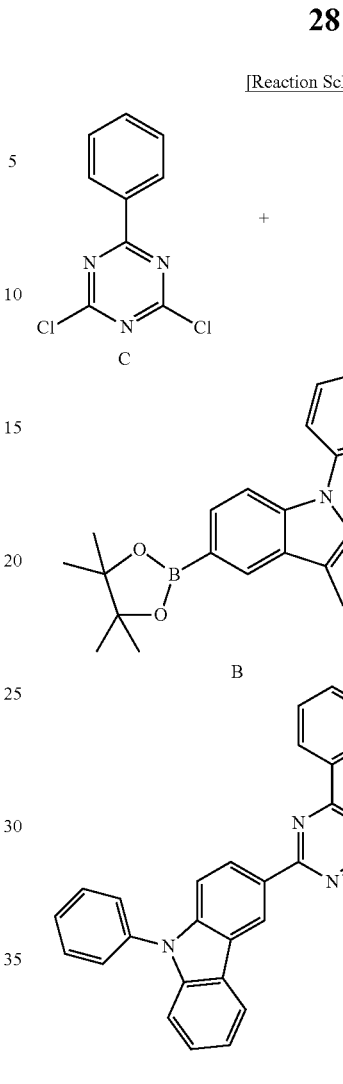

5 g (0.0135 mol) of material (A), 4.7 g (0.0176 mol) of N-phenyl carbazole boronic acid (material (B)), and 0.78 g (0.7 mmol) of tetrakis(triphenylphosphine)palladium were in suspended in 100 ml of tetrahydrofuran and 100 ml of toluene, and a solution prepared by dissolving 2.8 g (0.02 mol) of potassium carbonate in 100 ml of water was added thereto to form a mixture. The mixture was heated and refluxed for 9 hours. The liquid reactant was separated into two layers, and an organic layer thereof was cleaned with a sodium chloride saturated aqueous solution and dried with anhydrous sodium sulfate.

Then, an organic solvent therein was distilled and removed under a reduced pressure, and the residue of the reactant was recrystallized with toluene. The precipitate was filtered and cleaned with toluene, obtaining 8 g of a compound represented by Chemical Formula 9 (yield: 90%).

EXAMPLE 2

Synthesis of Compound Represented by Chemical Formula 10

The compound represented by Chemical Formula 10 as a specific example of an embodiment was synthesized according to the following Reaction Scheme 2.

5 g (0.0221 mol) of a material (C), 20.42 g (0.0553 mol) of N-phenyl carbazole boronic acid (material (B)), and 2.5 g (2.2 mmol) of tetrakis(triphenylphosphine)palladium were suspended in 200 ml of tetrahydrofuran and 200 ml of toluene, and a solution prepared by dissolving 9.17 g (0.067 mmol) of potassium carbonate in 200 ml of water was added thereto to form a mixture. The mixture was heated and refluxed for 9 hours. The liquid reactant was separated into two layers, and an organic layer therein was cleaned with a sodium chloride saturated aqueous solution and dried with anhydrous sodium sulfate.

Then, an organic solvent therein was distilled and removed under a reduced pressure, and the residue thereof was recrystallized with toluene. The precipitate was filtered and cleaned with toluene, obtaining 11.5 g of a compound represented by Chemical Formula 10 (yield: 81%).

The synthesized materials were measured regarding glass transition temperature and thermal decomposition temperature using DSC and TGA.

(Fabrication of Organic Photoelectric Device)

EXAMPLE 3

The compound synthesized according to Example 1 (as a host) and Ir(PPy)$_3$ (as a dopant) were used to fabricate an organic photoelectric device having the following structure.

A 1,000 Å-thick ITO was used as an anode, while a 1,000 Å-thick aluminum (Al) was used as a cathode.

An organic emission layer was formed to have the following structure.

ITO/DNTPD 60 nm/NPB 20 nm/TCTA 30 nm/EML (10%, 30 nm)/Alq3 20 nm/LiF/Al 100 nm

The organic photoelectric device was fabricated as follows. An ITO glass substrate having sheet resistance of 15 $\Omega/cm^2$ was cut to a size of 50 mm×50 mm×0.7 mm and ultrasonic wave cleaned in isopropyl alcohol and pure water for 5 minutes each, and UV ozone cleaned for 30 minutes to provide the anode.

DNTPD, NPB, and TCTA were deposited on an upper side of the anode under a vacuum degree of $650×10^{-7}$ Torr, and a deposition speed of 0.1 to 0.3 nm/s to form a hole transport layer (HTL) having a thickness of 1,100 Å.

Next, a 300 Å-thick emission layer was formed (using the compound of Example 1 as a host) under the same vacuum deposition conditions, and Ir(PPy)$_3$ (as a phosphorescent dopant) was simultaneously deposited therewith.

The phosphorescent dopant was deposited in an amount of 5 to 10 wt %, based on 100 wt % of the total weight of the emission layer by controlling the deposition speed.

Then, Alq3 was deposited to form a 200 Å-thick electron transport layer (ETL) under the same vacuum deposition conditions. On the electron transport layer (ETL), LiF and Al were sequentially deposited, completing the organic photoelectric device.

EXAMPLE 4

The compound synthesized according to Example 2 (as a host) and Ir(PPy)$_3$ (as a dopant) were used to fabricate an organic photoelectric device.

In particular, a 1,000 Å-thick ITO was used as an anode, while a 1,000 Å-thick aluminum (Al) was used as a cathode.

An organic emission layer was formed to have the following structure.

ITO/DNTPD 60 nm/TCTA 20 nm/NPB 30 nm/EML (10%, 30 nm)/Balq (5 nm)/Alq3 20 nm/LiF/Al 100 nm In particular, a method of manufacturing the organic photoelectric device included fabricating an anode by cutting an ITO glass substrate with a sheet resistance of 15 $\Omega/cm^2$ to have a size of 50 mm×50 mm×0.7 mm, ultrasonic wave cleaning the ITO glass substrate in acetone, isopropyl alcohol, and pure water for 15 minutes respectively, and UV ozone cleaning it for 30 minutes.

On the anode, DNTPD, NPD, and TCTA were deposited at a vacuum degree of $650×10^{-7}$ Torr and a deposition speed of 0.1 to 0.3 nm/s to form a 1,100 Å-thick hole transport layer (HTL).

Then, a 300 Å-thick emission layer was formed (using the compound of Example 2 as a host) under the same vacuum deposition conditions, and Ir(PPy)$_3$ (as a phosphorescent dopant) was simultaneously deposited therewith.

The phosphorescent dopant was deposited in an amount of 5 to 10 wt %, based on 100 wt % of the total weight of the emission layer, by controlling the deposition speed.

On the emission layer, Balq was deposited to form a 50 Å-thick hole inhibition layer under the same vacuum deposition conditions. Next, Alq3 was deposited under the same vacuum deposition conditions to form a 200 Å-thick electron transport layer (ETL). On the electron transport layer (ETL), LiF and Al were sequentially deposited, completing the organic photoelectric device.

COMPARATIVE EXAMPLE 1

An organic photoelectric device having a structure of ITO/DNTPD 60 nm/NPB 20 nm/TCTA 30 nm/CBP (10%, 30 nm)/BCP (5 nm)/Alq3 20 nm/LiF/Al 100 nm was fabricated according to the same method as Example 3 except for 4-N,N-dicarbazolebiphenyl (CBP) was used (as a host) instead of the compound according to Example 1.

Performance Measurement of Organic Photoelectric Device

Measurement Method

Each of the obtained organic photoelectric devices was measured for luminance change, current density change depending upon the voltage, and luminous efficiency. The specific method was as follows.

1) Measurement of Current Density Change Depending on Voltage Change

The obtained organic photoelectric device was measured for current value flowing in the unit device while increasing the voltage from 0 V to 10 V using a current-voltage meter (Keithley 2400), and the measured current value was divided by area to provide the result.

2) Measurement of Luminance Change Depending on Voltage Change

The obtained organic photoelectric device was measured for luminance using a luminance meter (Minolta Cs1000A) while increasing the voltage from 0 V to 10 V.

3) Measurement of Luminous Efficiency

Luminous efficiency was calculated by using luminance and current density from 1) and 2) and voltage.

Results

Table 1 shows results of the organic photoelectric devices according to the Examples and the Comparative Example.

TABLE 1

| | | | Luminance at 1,000 cd/m$^2$ | | | | |
|---|---|---|---|---|---|---|---|
| Compound | Initial driving voltage (V) | Driving voltage (V) | Luminous efficiency (cd/A) | Electric power efficiency (lm/W) | Maximum luminous efficiency (cd/A) | Maximum electric power efficiency (lm/W) | Color coordinate (x, y) |
| Comparative Example 1 (CBP) | 6.0 | 7.76 | 42.77 | 19.15 | 48.10 | 19.40 | 0.27, 0.64 |
| Example 3 (Chemical Formula 9) | 4.50 | 6.08 | 52.77 | 30.18 | 52.80 | 32.10 | 0.29, 0.63 |
| Example 4 (Chemical Formula 10) | 5.0 | 6.38 | 50.34 | 27.40 | 51.10 | 27.70 | 0.30, 0.63 |

Based on characteristic evaluation results of the organic photoelectric devices, the organic photoelectric devices according to Examples 3 and 4 exhibited a driving voltage of less than or equal to 6.5 V at a luminance of 1,000 nit, compared with the organic photoelectric device according to Comparative Example 1 having a driving voltage of 7.76 V. Accordingly, it may be seen that the devices according to the Examples exhibited superbly high device performance. The organic photoelectric devices according to Example 3 and 4 had superbly better device characteristics than the one according to Comparative Example 1.

In particular, the organic photoelectric device according to Example 3 had superbly high device performance compared with the device according to Comparative Example 1. The organic photoelectric device according to Example 3 exhibited better luminous efficiency than the device according to Comparative Example 1 and furthermore, at least 1.23 times better electric power efficiency (due to low driving voltage) than the device according to Comparative Example 1.

The organic photoelectric device according to Example 3 had the greatest maximum electric power efficiency of 30.18 lm/w, which was 165% higher than the device according to Comparative Example 1.

Therefore, it may be seen that organic photoelectric devices including the compounds according to an embodiment showed a low driving voltage and high luminous efficiency and thus an increased life-span of a device.

By way of summation and review, an organic photoelectric device transforms electrical energy into light by applying current to an organic light emitting material. It may have a structure in which a functional organic material layer is interposed between an anode and a cathode. The organic material layer may have a multi-layer structure including different materials, e.g., a hole injection layer (HIL), a hole transport layer (HTL), an emission layer, an electron transport layer (ETL), and an electron injection layer (EIL), in order to improve efficiency and stability of an organic photoelectric device.

As described above, in an organic light emitting diode, an organic material layer may include a light emitting material and a charge transport material, e.g., a hole injection material, a hole transport material, an electron transport material, an electron injection material, and the like.

In such an organic photoelectric device, when a voltage is applied between an anode and a cathode, holes from the anode and electrons from the cathode are injected to an organic material layer and recombined to generate excitons having high energy. The generated excitons generate light having certain wavelengths while shifting to a ground state.

One type of organic light emitting diode includes a low molecular weight aromatic diamine and aluminum complex as an emission layer forming material. The organic layer may have a structure in which a thin film (hole transport layer (HTL)) of a diamine derivative and a thin film of tris(8-hydroxy-quinolate)aluminum (Alq3) are laminated.

Recently, a phosphorescent light emitting material as a light emitting material of an organic light emitting diode (in addition to the fluorescent light emitting material) has been considered. Such a phosphorescent material may emit light by transiting the electrons from a ground state to an exited state, non-radiance transiting of a singlet exciton to a triplet exciton through intersystem crossing, and/or transiting a triplet exciton to a ground state to emit light.

The light emitting material may be classified as blue, green, and red light emitting materials according to emitted colors, and yellow and orange light emitting materials to emit colors approaching natural colors.

When one material is used as a light emitting material, a maximum light emitting wavelength may be shifted to a long wavelength or color purity may decrease because of interactions between molecules, or device efficiency may decrease because of a light emitting quenching effect. Therefore, a host/dopant system may be included as a light emitting material in order to help improve color purity and increase luminous efficiency and stability through energy transfer.

In order to implement excellent performance of an organic photoelectric device, a material constituting an organic material layer, e.g., a hole injection material, a hole transport material, a light emitting material, an electron transport material, an electron injection material, and a light emitting material such as a host and/or a dopant, should be stable and have good efficiency.

The embodiments provide a compound for an organic photoelectric device that may act as an electron injection and/or electron transport material, and may also act as a light emitting host along with an appropriate dopant.

The embodiments also provide an organic photoelectric device having excellent life-span, efficiency, driving voltage, electrochemical stability, and thermal stability. For example, an organic photoelectric device having excellent life-span characteristic and high luminous efficiency at a low driving voltage may be provided due to excellent electrochemical and thermal stability.

Example embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the present invention as set forth in the following claims.

What is claimed is:

1. An organic photoelectric device, comprising:
an anode;
a cathode; and
at least one organic thin layer between the anode and the cathode,
wherein the at least one organic thin layer includes a compound represented by the following Chemical Formula 1:

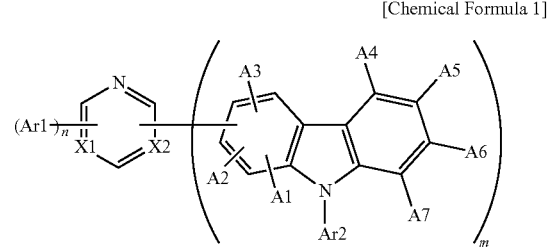

[Chemical Formula 1]

wherein, in Chemical Formula 1,
Ar1 is selected from the group of an unsubstituted C6 to C30 aryl group, a C1 to C30 alkyl substituted C6 to C30 aryl group, and a substituted or unsubstituted C2 to C30 heteroaryl group,
Ar2 is selected from the group of a substituted or unsubstituted C6 to C30 aryl group and a substituted or unsubstituted C2 to C30 heteroaryl group,
A1 to A4, A6, and A7 are each independently selected from the group of hydrogen, a substituted or unsubstituted C6 to C30 aryl group, a substituted or unsubstituted C2 to C30 heteroaryl group, and a substituted or unsubstituted C1 to C30 alkyl group, A5 is selected from the group of hydrogen, a substituted or unsubstituted C6 to C30 aryl group, and a substituted or unsubstituted C1 to C30 alkyl group, provided that at least three of A4 to A7 are hydrogen, X1 and X2 are each independently N or CH, m+n=3, m and n are each integers, and m is not 0, and wherein the at least one organic thin layer includes an emission layer, and the compound for an organic photoelectric device is included in the emission layer.

2. The organic photoelectric device as claimed in claim 1, wherein the compound represented by Chemical Formula 1 is represented by the following Chemical Formula 2:

[Chemical Formula 2]

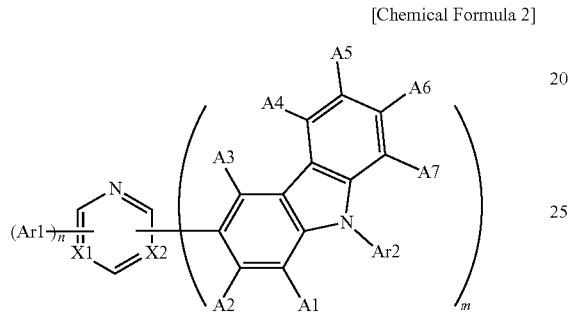

wherein, in Chemical Formula 2,

Ar1 is selected from the group of an unsubstituted C6 to C30 aryl group, a C1 to C30 alkyl substituted C6 to C30 aryl group, and a substituted or unsubstituted C2 to C30 heteroaryl group, Ar2 is selected from the group of a substituted or unsubstituted C6 to C30 aryl group and a substituted or unsubstituted C2 to C30 heteroaryl group, A1 to A4, A6, and A7 are each independently selected from the group of hydrogen, a substituted or unsubstituted C6 to C30 aryl group, a substituted or unsubstituted C2 to C30 heteroaryl group, and a substituted or unsubstituted C1 to C30 alkyl group, A5 is selected from the group of hydrogen, a substituted or unsubstituted C6 to C30 aryl group, and a substituted or unsubstituted C1 to C30 alkyl group, provided that at least three of A4 to A7 are hydrogen, X1 and X2 are each independently N or CH, m+n=3, m and n are each integers, and m is not 0.

3. The organic photoelectric device as claimed in claim 2, wherein m is 2 or 3, and X1 and X2 are N.

4. The organic photoelectric device as claimed in claim 1, wherein m is 2.

5. The organic photoelectric device as claimed in claim 1, wherein X1 is N.

6. The organic photoelectric device as claimed in claim 5, wherein X2 is N.

7. The organic photoelectric device as claimed in claim 1, wherein n does not equal 0 and Ar1 is a C1 to C30 alkyl substituted phenyl group or an unsubstituted phenyl group.

8. The organic photoelectric device as claimed in claim 1, wherein Ar2 is selected from the group of a substituted or unsubstituted phenyl group and a substituted or unsubstituted biphenyl group.

9. The organic photoelectric device as claimed in claim 1, wherein at least one of A1 to A7 is selected from the group of a substituted or unsubstituted C6 to C12 aryl group and a substituted or unsubstituted C1 to C6 alkyl group.

10. The organic photoelectric device as claimed in claim 1, wherein the compound represented by Chemical Formula 1 is represented by one of the following Chemical Formulae 3-11:

[Chemical Formula 3]

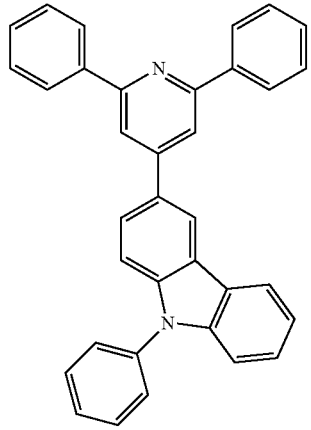

[Chemical Formula 4]

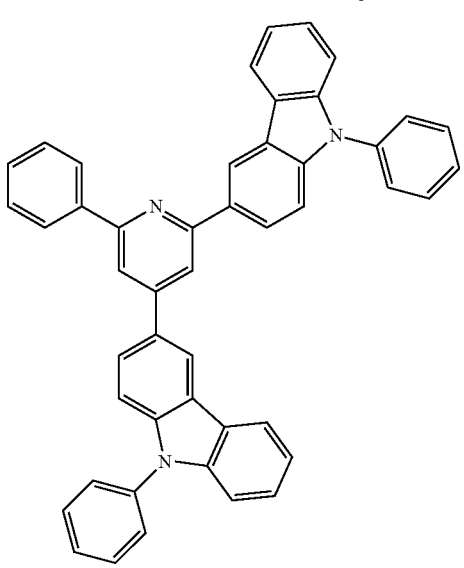

[Chemical Formula 5]

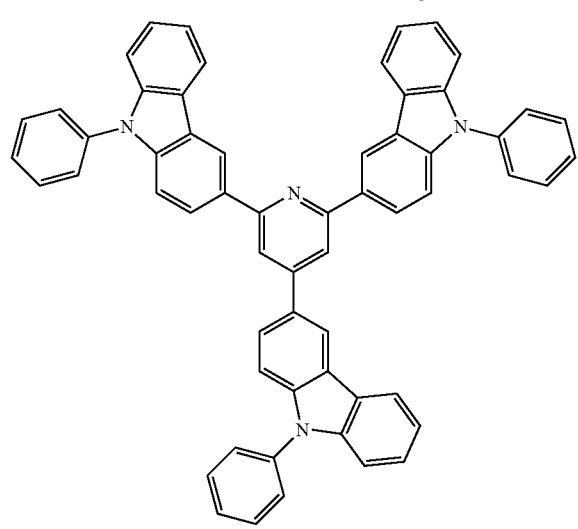

[Chemical Formula 6]
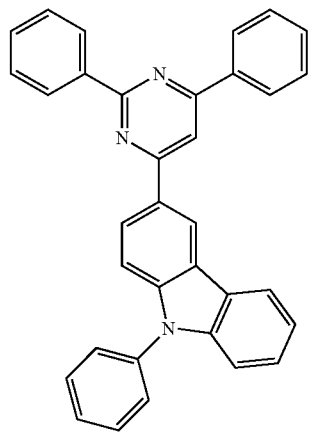
[Chemical Formula 7]
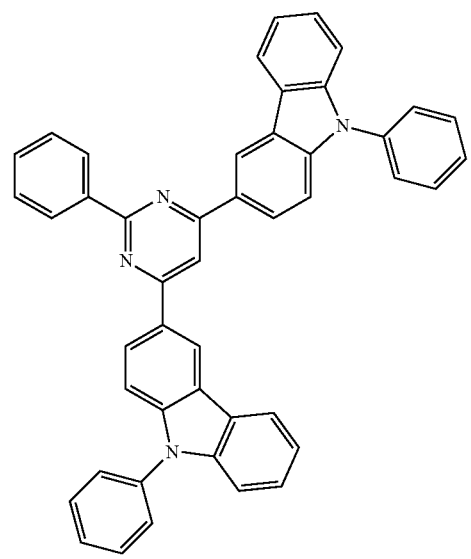
[Chemical Formula 8]
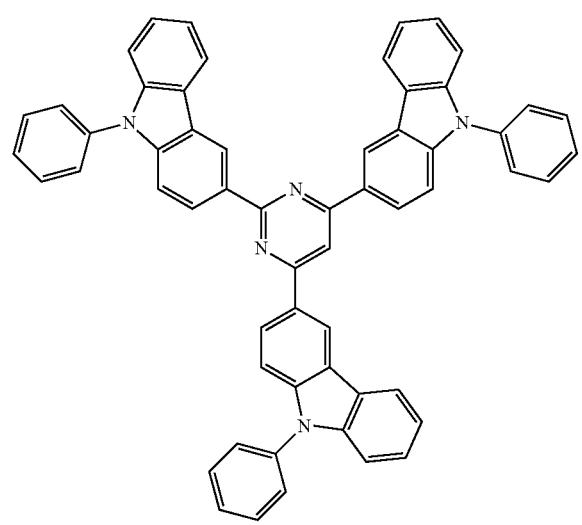
[Chemical Formula 9]
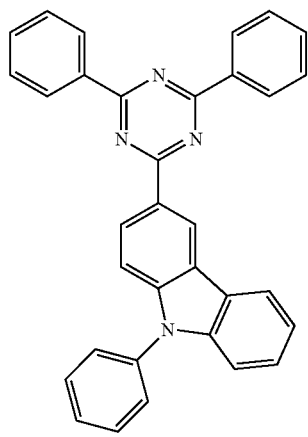
[Chemical Formula 10]
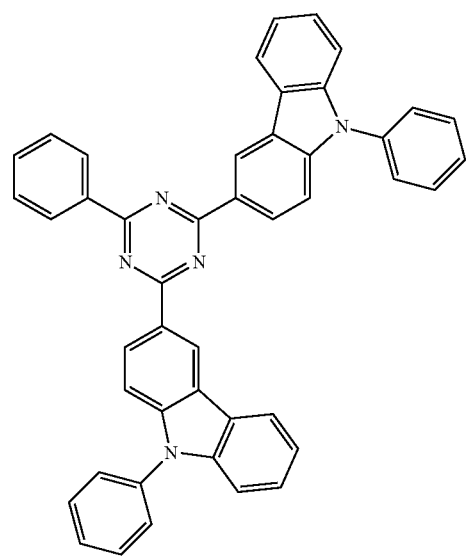
[Chemical Formula 11]
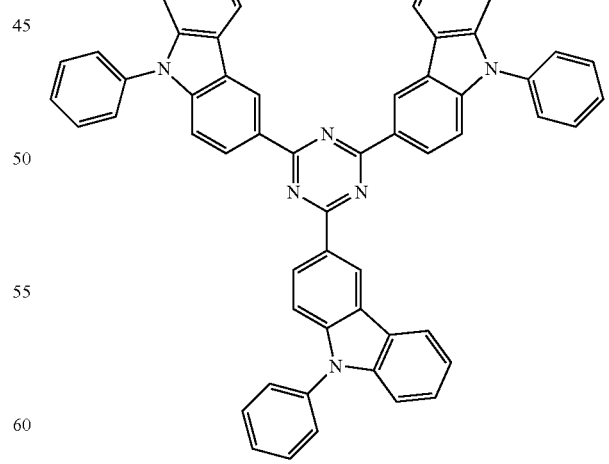
11. The organic photoelectric device as claimed in claim 1, wherein the compound represented by Chemical Formula 1 is represented by one of the following Chemical Formulae 12-20:

[Chemical Formula 12]
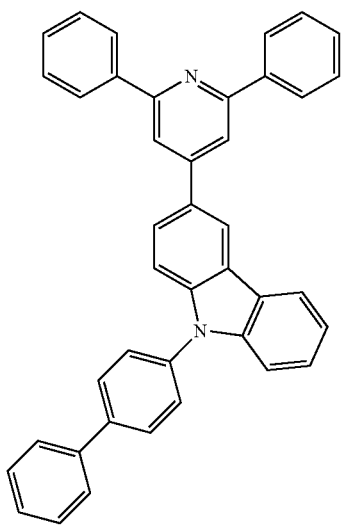
[Chemical Formula 13]
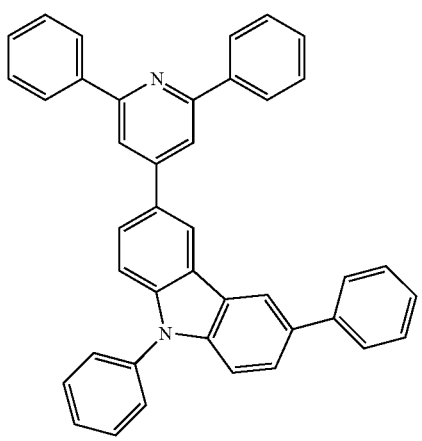
[Chemical Formula 14]
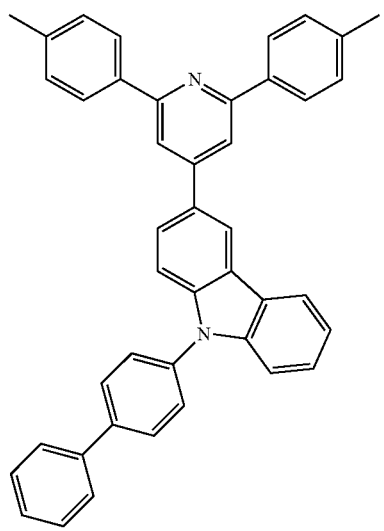
[Chemical Formula 15]
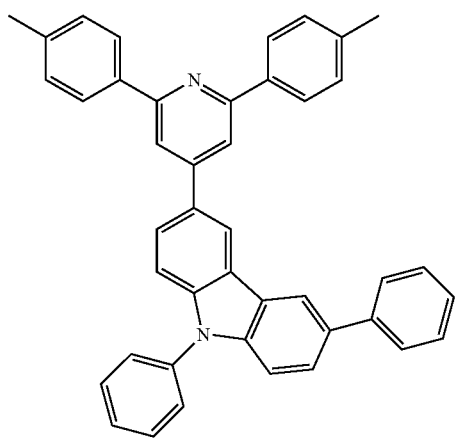
[Chemical Formula 16]
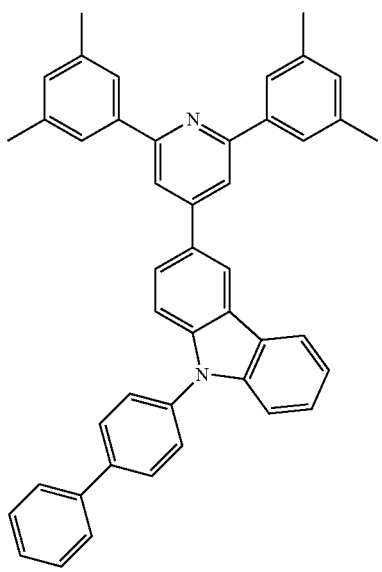
[Chemical Formula 17]
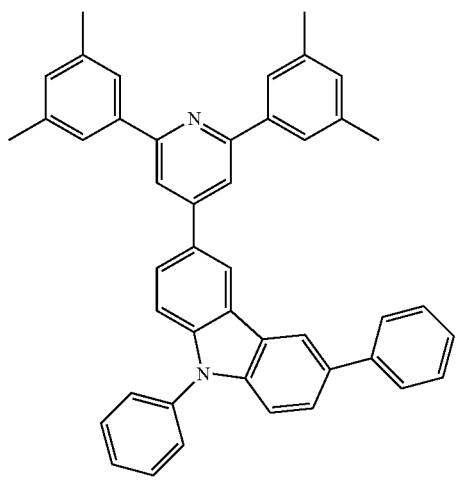

[Chemical Formula 18]
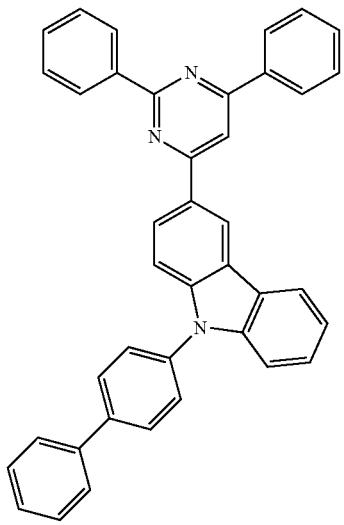
[Chemical Formula 19]
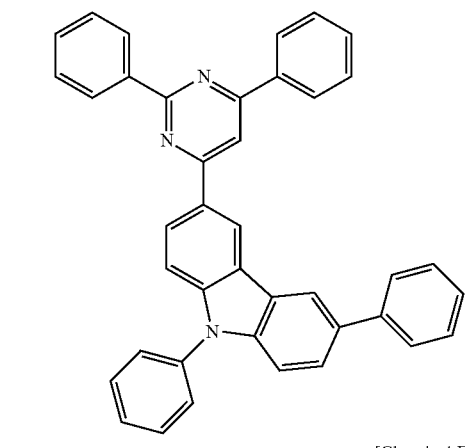
[Chemical Formula 20]
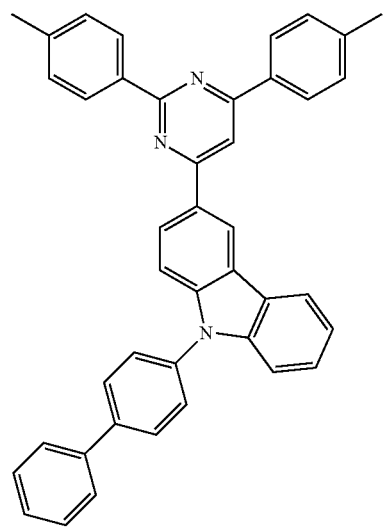
12. The organic photoelectric device as claimed in claim 1, wherein the compound represented by Chemical Formula 1 is represented by one of the following Chemical Formulae 21-29:
[Chemical Formula 21]
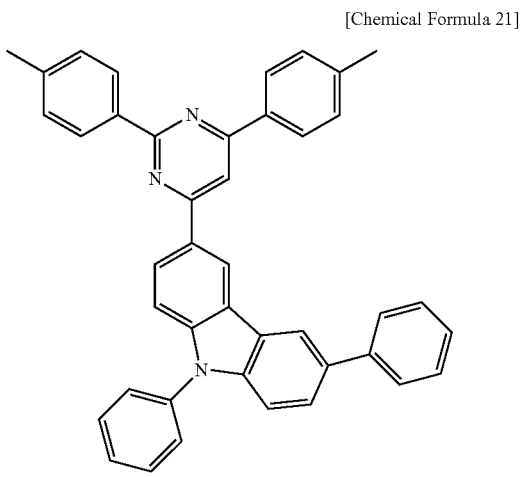
[Chemical Formula 22]
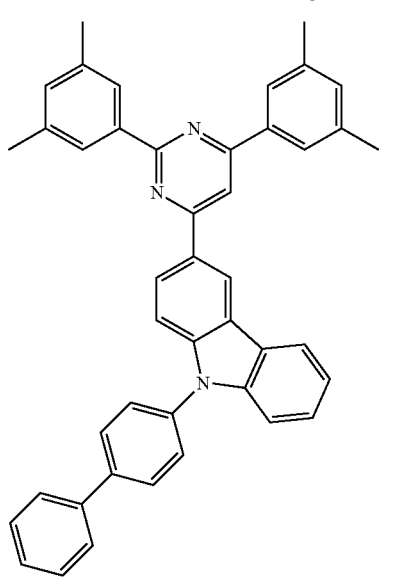
[Chemical Formula 23]
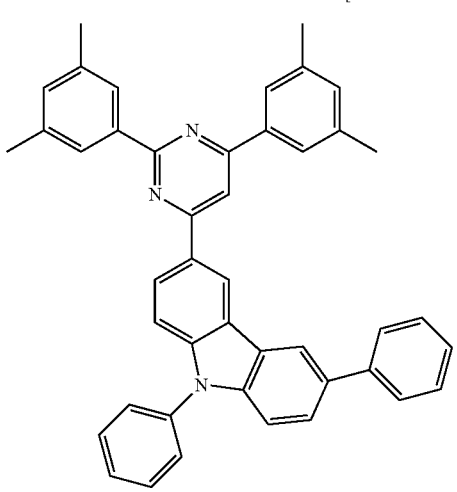

-continued
[Chemical Formula 24]
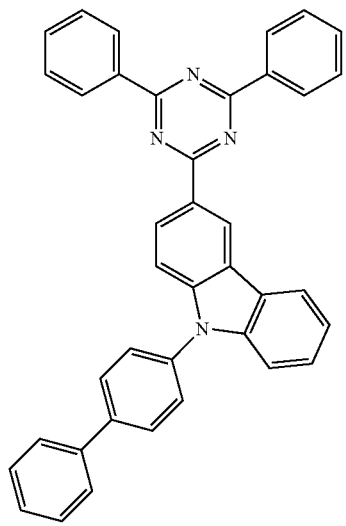
[Chemical Formula 25]
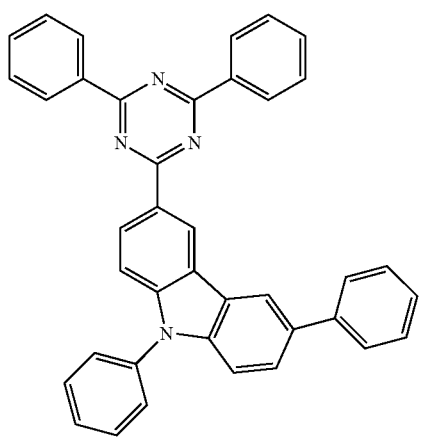
[Chemical Formula 26]
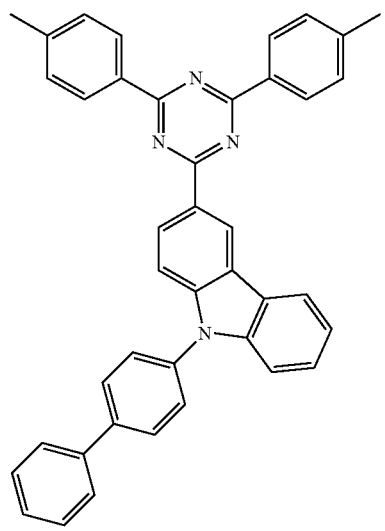
[Chemical Formula 27]
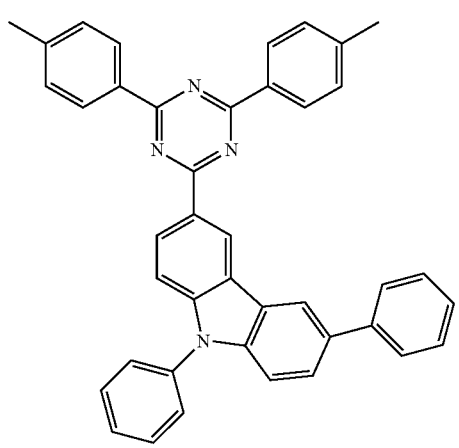
[Chemical Formula 28]
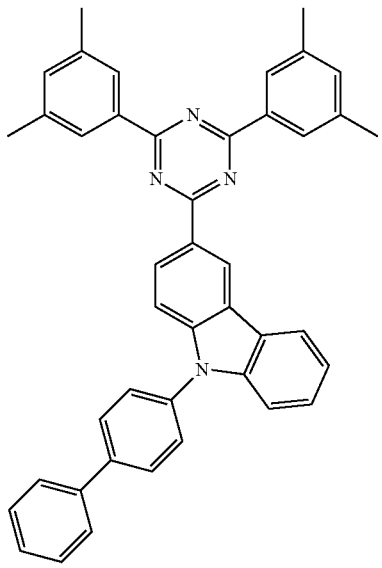
[Chemical Formula 29]
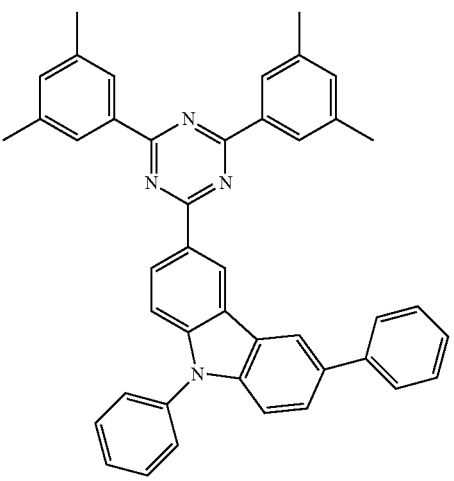

13. The organic photoelectric device as claimed in claim 1, wherein the at least one organic thin layer includes the emission layer, and further includes a hole transport layer (HTL), a hole injection layer (HIL), an electron transport layer (ETL), an electron injection layer (EIL), a hole blocking layer, or a combination thereof.

14. The organic photoelectric device as claimed in claim 1, wherein the at least one organic thin layer further includes an electron transport layer (ETL) or an electron injection layer (EIL), and the compound for an organic photoelectric device is included in the electron transport layer (ETL) or the electron injection layer (EIL).

15. The organic photoelectric device as claimed in claim 1, wherein the compound for an organic photoelectric device is a phosphorescent or fluorescent host material in the emission layer.

16. The organic photoelectric device as claimed in claim 1, wherein the compound for an organic photoelectric device is a fluorescent blue dopant material in the emission layer.

17. The organic photoelectric device as claimed in claim 1, wherein the organic photoelectric device is selected from the group of an organic light emitting diode, an organic solar cell, an organic transistor, an organic photo conductor drum, and an organic memory device.

18. A display device including the organic photoelectric device as claimed in claim 1.

19. The organic photoelectric device as claimed in claim 1, wherein the compound represented by Chemical Formula 1 is represented by one of the following Chemical Formulae 3-10:

[Chemical Formula 4]

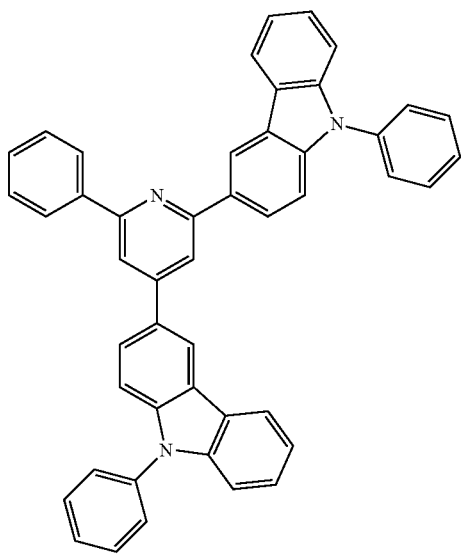

[Chemical Formula 5]

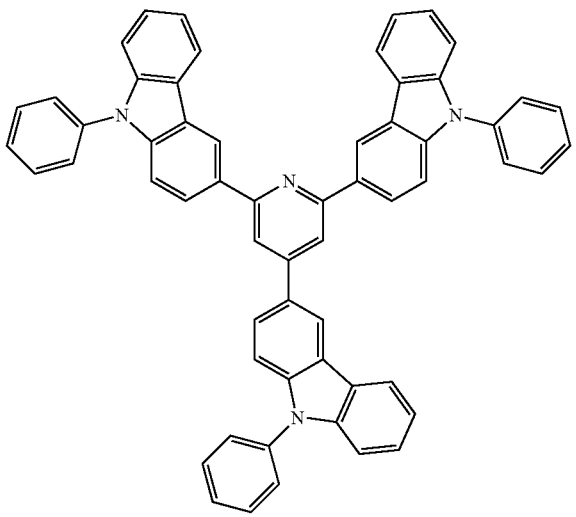

[Chemical Formula 3]

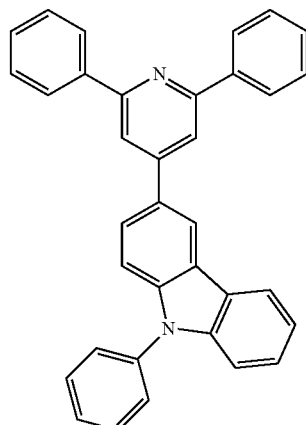

[Chemical Formula 6]

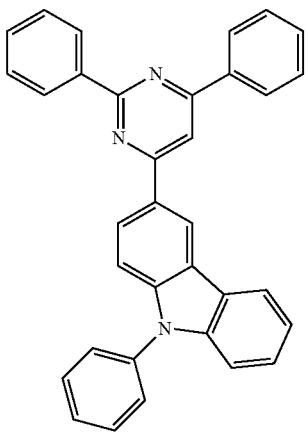

[Chemical Formula 7]
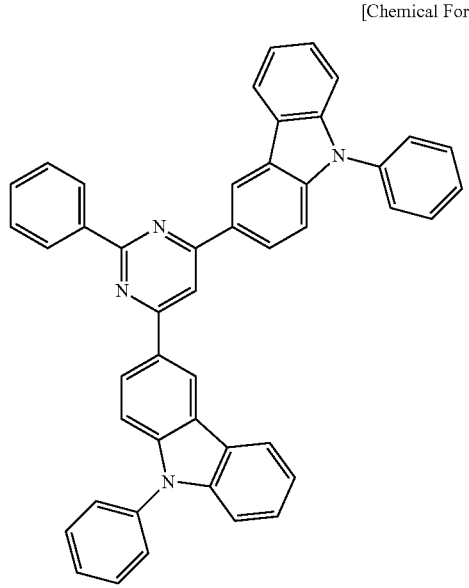
[Chemical Formula 8]
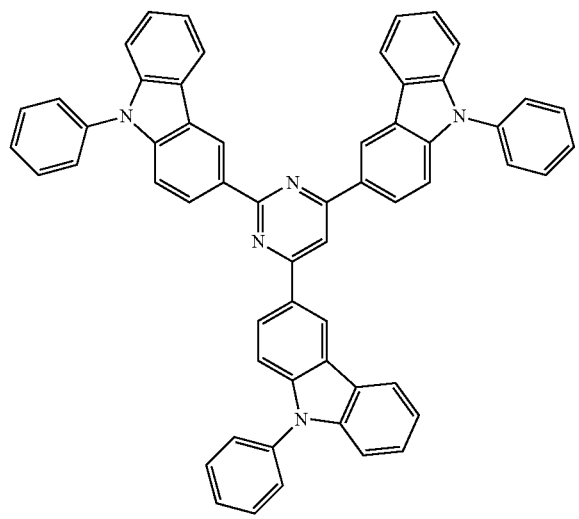
[Chemical Formula 9]
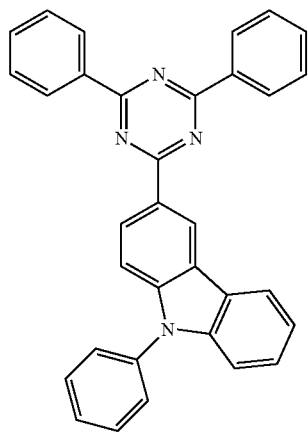
[Chemical Formula 10]
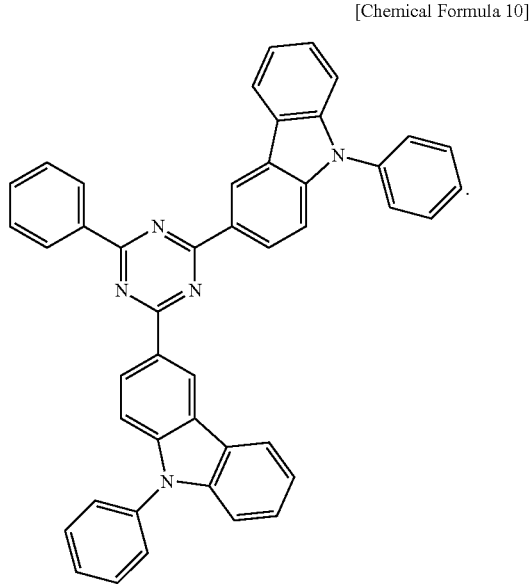
* * * * *